United States Patent
Hoffmann et al.

(10) Patent No.: US 9,041,126 B2
(45) Date of Patent: May 26, 2015

(54) DEEPLY DEPLETED MOS TRANSISTORS HAVING A SCREENING LAYER AND METHODS THEREOF

(71) Applicant: SuVolta, Inc., Los Gatos, CA (US)

(72) Inventors: Thomas Hoffmann, Los Gatos, CA (US); Lucian Shifren, San Jose, CA (US); Scott E. Thompson, Gainesville, FL (US); Pushkar Ranade, Los Gatos, CA (US); Jing Wang, San Jose, CA (US); Paul E. Gregory, Palo Alto, CA (US); Sachin R. Sonkusale, Los Gatos, CA (US); Lance Scudder, Sunnyvale, CA (US); Dalong Zhao, San Jose, CA (US); Teymur Bakhishev, San Jose, CA (US); Yujie Liu, San Jose, CA (US); Lingquan Wang, Irvine, CA (US); Weimin Zhang, San Jose, CA (US); Sameer Pradhan, San Jose, CA (US); Michael Duane, San Carlos, CA (US); Sung Hwan Kim, San Jose, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 0 days.

(21) Appl. No.: 14/019,187

(22) Filed: Sep. 5, 2013

(65) Prior Publication Data

US 2014/0084385 A1 Mar. 27, 2014

Related U.S. Application Data

(60) Provisional application No. 61/704,310, filed on Sep. 21, 2012.

(51) Int. Cl.
*H01L 29/94* (2006.01)
*H01L 29/76* (2006.01)
(Continued)

(52) U.S. Cl.
CPC ...... *H01L 29/7833* (2013.01); *H01L 29/66545* (2013.01); *H01L 29/7834* (2013.01); *H01L 29/1083* (2013.01)

(58) Field of Classification Search
CPC ............ H01L 29/7833; H01L 29/1045; H01L 29/66545
USPC .......................................... 257/402, E29.054
See application file for complete search history.

(56) References Cited

U.S. PATENT DOCUMENTS 3,958,266 A 5/1976 Athanas
(Continued)

FOREIGN PATENT DOCUMENTS

EP 0274278 7/1988
(Continued)

OTHER PUBLICATIONS

Abiko, H et al., "A Channel Engineering Combined with Channel Epitaxy Optimization and TED Suppression for 0.15 μm n-n Gate CMOS Technology", 1995 Symposium on VLSI Technology Digest of Technical Papers, pp. 23-24, 1995.
(Continued)

*Primary Examiner* — Tu-Tu Ho
(74) *Attorney, Agent, or Firm* — Baker Botts L.L.P.

(57) ABSTRACT

A semiconductor transistor structure fabricated on a silicon substrate effective to set a threshold voltage, control short channel effects, and control against excessive junction leakage may include a transistor gate having a source and drain structure. A highly doped screening region lies is embedded a vertical distance down from the surface of the substrate. The highly doped screening region is separated from the surface of the substrate by way of a substantially undoped channel layer which may be epitaxially formed. The source/drain structure may include a source/drain extension region which may be raised above the surface of the substrate. The screening region is preferably positioned to be located at or just below the interface between the source/drain region and source/drain extension portion. The transistor gate may be formed below a surface level of the silicon substrate and either above or below the heavily doped portion of the source/drain structure.

19 Claims, 16 Drawing Sheets

(51) Int. Cl.
*H01L 29/78* (2006.01)
*H01L 29/66* (2006.01)
*H01L 29/10* (2006.01)

(56) References Cited

U.S. PATENT DOCUMENTS

| | | |
|---|---|---|
| 4,000,504 A | 12/1976 | Berger |
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,583,361 A | 12/1996 | Morishita |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |

(56) References Cited

U.S. PATENT DOCUMENTS

| | | |
|---|---|---|
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |

(56) References Cited

U.S. PATENT DOCUMENTS

| | | | |
|---|---|---|---|
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2004/0206951 A1* | 10/2004 | Mirabedini et al. ............ 257/19 |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2008/0299735 A1* | 12/2008 | Nouri et al. .................. 438/300 |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |

(56) References Cited

U.S. PATENT DOCUMENTS

| | | | |
|---|---|---|---|
| 2009/0321849 | A1 | 12/2009 | Miyamura et al. |
| 2010/0012988 | A1 | 1/2010 | Yang et al. |
| 2010/0038724 | A1 | 2/2010 | Anderson et al. |
| 2010/0100856 | A1 | 4/2010 | Mittal |
| 2010/0148153 | A1 | 6/2010 | Hudait et al. |
| 2010/0149854 | A1 | 6/2010 | Vora |
| 2010/0187641 | A1 | 7/2010 | Zhu et al. |
| 2010/0207182 | A1 | 8/2010 | Paschal |
| 2010/0270600 | A1 | 10/2010 | Inukai et al. |
| 2011/0059588 | A1 | 3/2011 | Kang |
| 2011/0073961 | A1 | 3/2011 | Dennard et al. |
| 2011/0074498 | A1 | 3/2011 | Thompson et al. |
| 2011/0079860 | A1 | 4/2011 | Verhulst |
| 2011/0079861 | A1 | 4/2011 | Shifren et al. |
| 2011/0095811 | A1 | 4/2011 | Chi et al. |
| 2011/0121404 | A1 | 5/2011 | Shifren et al. |
| 2011/0147828 | A1 | 6/2011 | Murthy et al. |
| 2011/0169082 | A1 | 7/2011 | Zhu et al. |
| 2011/0175170 | A1 | 7/2011 | Wang et al. |
| 2011/0180880 | A1 | 7/2011 | Chudzik et al. |
| 2011/0193164 | A1 | 8/2011 | Zhu |
| 2011/0212590 | A1 | 9/2011 | Wu et al. |
| 2011/0230039 | A1 | 9/2011 | Mowry et al. |
| 2011/0242921 | A1 | 10/2011 | Tran et al. |
| 2011/0248352 | A1 | 10/2011 | Shifren |
| 2011/0294278 | A1 | 12/2011 | Eguchi et al. |
| 2011/0309447 | A1 | 12/2011 | Arghavani et al. |
| 2012/0021594 | A1 | 1/2012 | Gurtej et al. |
| 2012/0034745 | A1 | 2/2012 | Colombeau et al. |
| 2012/0056275 | A1 | 3/2012 | Cai et al. |
| 2012/0065920 | A1 | 3/2012 | Nagumo et al. |
| 2012/0108050 | A1 | 5/2012 | Chen et al. |
| 2012/0132998 | A1 | 5/2012 | Kwon et al. |
| 2012/0138953 | A1 | 6/2012 | Cai et al. |
| 2012/0146155 | A1 | 6/2012 | Hoentschel et al. |
| 2012/0167025 | A1 | 6/2012 | Gillespie et al. |
| 2012/0187491 | A1 | 7/2012 | Zhu et al. |
| 2012/0190177 | A1 | 7/2012 | Kim et al. |
| 2012/0223363 | A1 | 9/2012 | Kronholz et al. |
| 2012/0261754 | A1* | 10/2012 | Cheng et al. .......... 257/347 |

FOREIGN PATENT DOCUMENTS

| | | |
|---|---|---|
| EP | 0312237 | 4/1989 |
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Contern $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC". Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0I- μm Delta-Doped MOSFET Fabricated with Post-Low-Energy Implanting Selective Epitaxy" IEEE Transactions on Electron Devices, vol. 45, No, 4, pp. 809-814, Apr. 1998.

Ohguro, T et al., "An 0.18- μm CMOS for Mixed Digital and Analog Aplications with Zero-Volt-Vth Epitaxial-Channel MOSFETs", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE; Vo. 87, No. 4, pp. 537-570, Apr. 1999.

Banerjee, et al. "Compensating Non-Optical Effects using Electrically-Driven Optical Proximity Correction", Proc. of SPIE vol. 7275 72750E, 2009.

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

(56) References Cited

OTHER PUBLICATIONS

Hori, et al., "A 0.1 μm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

Notification of Transmittal of the International Search Report and the Written Opinion of the International Searching Authority, or the Declaration, International application No. PCT/US2013/060045, 16 pages, Feb. 21, 2014.

PCT Notification of Invitation to Pay Additional Fees and , Where Applicable, Protest Fee; RE: Intl. Appln. PCT/US2013/060045 mailed Nov. 22, 2013; Int'l filing date Sep. 17, 2013; from foreign . 0444 (5 pgs), Nov. 22, 2013.

\* cited by examiner

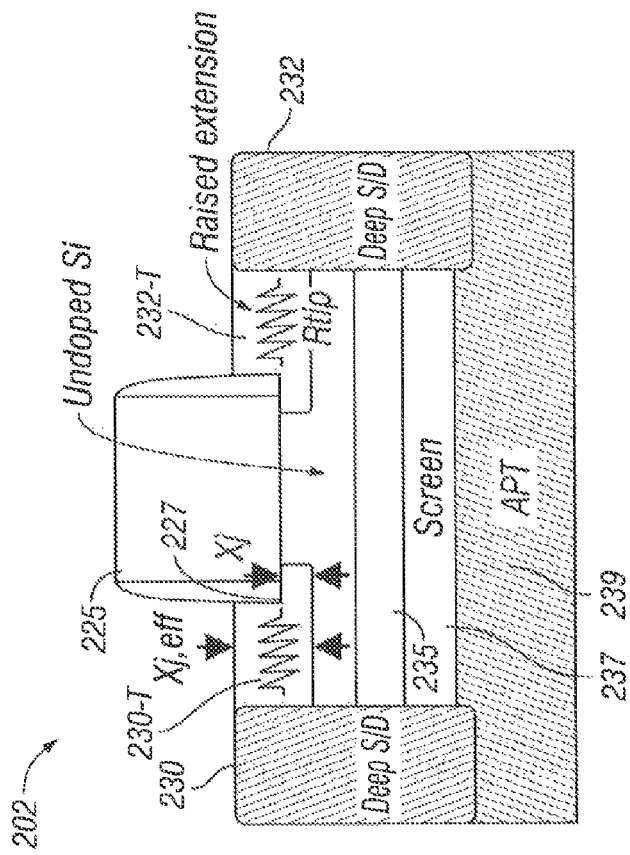
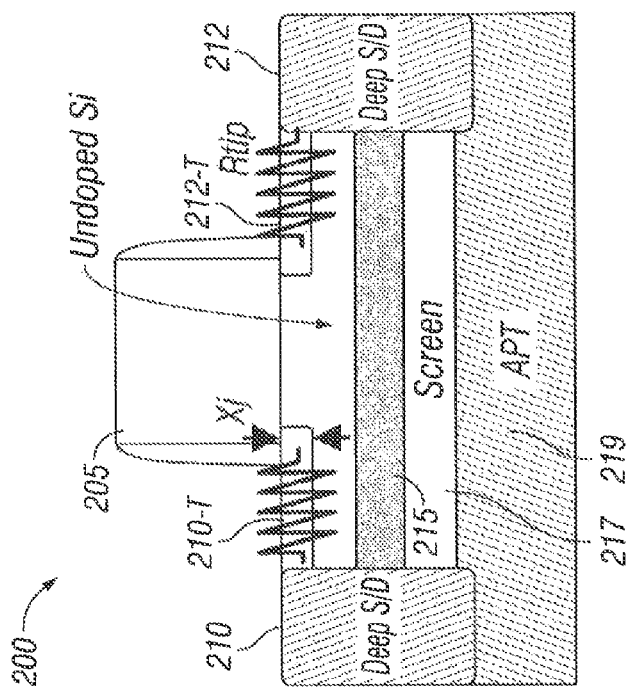
FIG. 2B
FIG. 2A

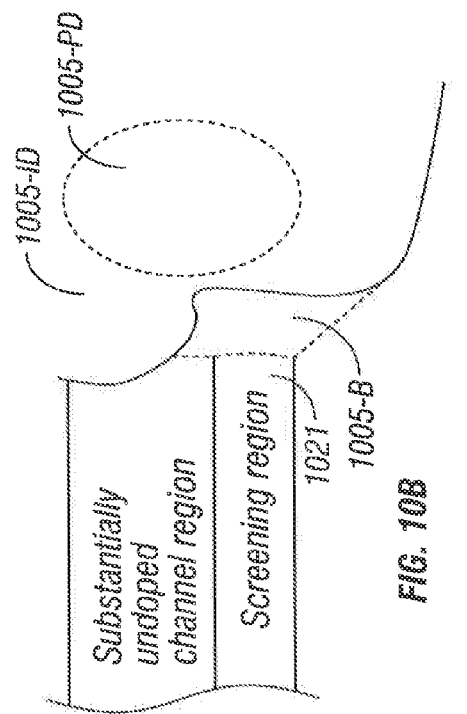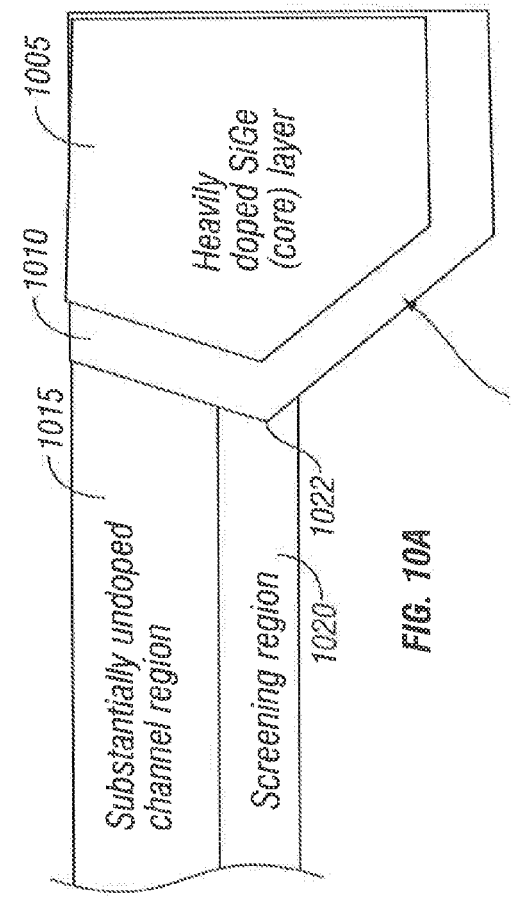

DDC misaligned by 5 nm

DEEPLY DEPLETED MOS TRANSISTORS HAVING A SCREENING LAYER AND METHODS THEREOF

CROSS REFERENCE TO RELATED APPLICATIONS

This application claims the benefit of U.S. Provisional Application No. 61/704,310 filed Sep. 21, 2013.

TECHNICAL FIELD

The following disclosure relates in general to semiconductor devices and processing and more particularly to methods relating to reducing subthreshold leakage current in a transistor device including a structure and method of fabrication of a reduced leakage transistor.

BACKGROUND

Many integrated circuit designs use a variety of cells that perform specific functions. Integrated circuits can include logic, memory, controller, and other functional blocks. Semiconductor integrated circuits are fabricated in a semiconductor process, often using a CMOS process. Transistors are formed in a semiconductor substrate and usually involve a sequence of fabrication steps that result in a gate with adjacent source and drain, with the source and drain being formed in a channel. A key setting for a transistor is the threshold voltage. A known method of setting threshold voltage is to place dopants in the channel area of opposite polarity from the dopants of the source and drain. Variations on channel doping include broadly imparting dopant material to fill up the volume of the channel. Other techniques include using pocket implants, also called halo doping, whereby ion implantation of channel dopants is limited to a small space that just adjoins each edge of the source and drain so that the remainder of the channel volume can remain substantially undoped so as to set the threshold voltage more precisely. As devices shrink, however, precision placement of dopants is increasingly difficult. Halo doping processes are imperfect and result in stray dopant material in unwanted locations in the channel area, making precision setting of threshold voltage very difficult. Threshold voltage variation has become an increasing problem and a limiter in rendering circuit designs that could otherwise take advantage of transistor size scaling. As a result of imprecise threshold voltage setting, while the scaling of transistor dimension has continued over time, the associated desired scaling down of supply voltage has not. The lack of scaling of power has hindered the ability for designers to create improved, reduced-power integrated circuits.

Low threshold voltage devices are generally used for high speed circuits, though low threshold voltage devices tend to have higher subthreshold leakage power. Designers, therefore, tend to design for higher threshold voltage. A common device design for higher threshold voltage is to impart dopants in the transistor channel that are of opposite polarity than the dopants in the source and drain. An advantage of providing dopants in the transistor channel is the relative improvement, in controlling short channel effects. As critical dimensions shrink, however, with greater relative number of dopants per unit volume in the channel, there may be more opportunity for junctions to form between the heavily doped source/drain regions and the channel region, creating a pathway for junction leakage.

BRIEF DESCRIPTION OF THE DRAWINGS

For a more complete understanding of the present disclosure and the advantages thereof, reference is now made to the following descriptions taken in conjunction with the accompanying drawings, wherein like reference numerals represent like parts, in which:

FIGS. 2A and 2B show an exemplary scheme for scaling a DDC transistor to control short channel effects;

FIGS. 10A-10B illustrates an exemplary DDC transistor structure having a screening region positioned relative to respective source/drain structures;

DETAILED DESCRIPTION

Figure 1:
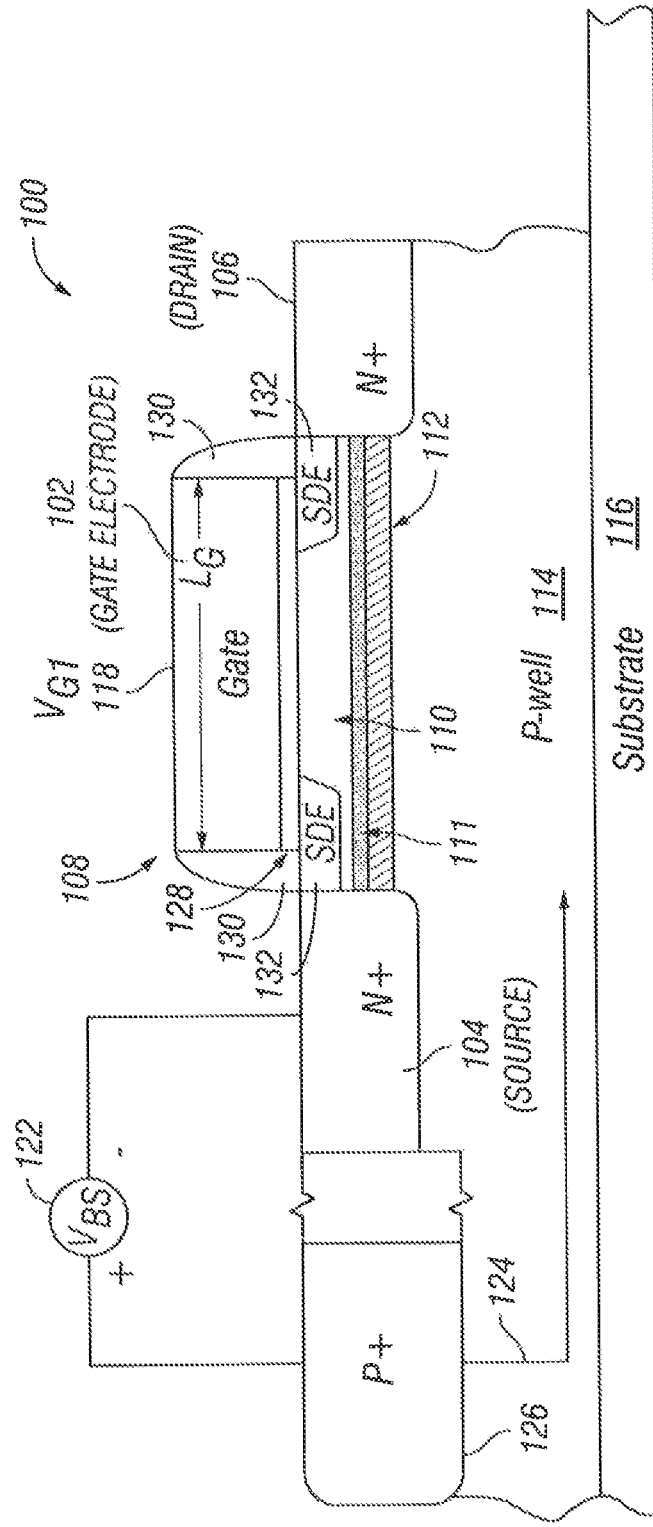
FIG. 1 shows an embodiment of a Deeply Depleted Channel (DDC) transistor in cross-sectional view.

Even though electronic devices are often designed as if transistors are identical in structure and performance, in reality it is impossible to manufacture as few as two completely identical transistors, especially for nanometer scale transistors. This problem is even, more acute when considering how to match performance of widely spaced transistors that may be tens of thousands of nanometers apart on the same die, transistors on neighboring die in the same wafer, transistors on different wafers, or even transistors manufactured at different fabricating facilities. Variations can occur due to process differences such as variation in patterning that can change channel, gate, and spacer size, or variation in deposition or implantation steps that can lead to differences in any features of the semiconductor device, including work function, step heights, or random dopant fluctuations causing variation in the voltage characteristics of the transistor.

Transistor matching issues generally increase in significance as transistors are decreased in size. Threshold voltage mismatch typically increases inversely proportional according to the square root of the transistor area. For certain transistor attributes such as subthreshold current or threshold voltage variation, the matching variation in nanometer scale transistors can be great enough to be detrimental to functionality, ultimately leading to low yield. In addition, many common CMOS processing techniques that involve the introduction of dopants into the transistor channel can result in significant variation in dopant placement near the channel, affecting the voltage at which the transistor operates.

Many integrated circuit designs use a variety of cells that perform specific functions. Integrated circuits can include logic, memory, controller, and other functional blocks. Semiconductor integrated circuits are fabricated in a semiconductor process, often using a CMOS process. Transistors are formed in a semiconductor substrate and usually involve a sequence of fabrication steps that result in a gate with adjacent source and drain, with the source and drain being formed in a channel. A key attribute of a transistor is the threshold voltage that determines the voltage at which a transistor can be switched. Low threshold voltage devices are generally used for high speed circuits. High threshold voltage devices are generally used for low power circuits, though a range of threshold voltage settings may be used depending on the design parameters and desired characteristics for the circuit block. It is generally known that variation in threshold voltage from the specification for the device is undesirable. Threshold voltage is typically set by incorporating dopants into the transistor channel, either by way of direct channel implantation adjacent the gate oxide or by way of pocket or halo implants adjacent the source and drain. Threshold voltage variation can arise due to random dopant fluctuations in the implanted channel area. The variation problem worsens as critical dimensions shrink because of the greater doping relative to the size of the transistor channel, thus giving rise to a greater impact of dopant fluctuations as the affected volume of the channel becomes smaller. In effect, while CMOS technology has improved to allow continued scaling down of critical dimensions, the associated and desired scaling down of voltage has not followed due to the persistence of the transistor variation.

Transistors having improved threshold voltage variation, and therefore allowing for scaling of voltage, are disclosed herein. Embodiments of structures and fabrication methods allowing for reliable setting of threshold voltage and improved mobility, transconductance, drive current, strong body coefficient, and reduced junction capacitance are provided. More specifically, embodiments of doping profiles to result in different Vt targets for the different transistor device types are disclosed.

FIG. 1 shows an embodiment of a Deeply Depleted Channel (DDC) transistor 100 having an enhanced body coefficient along with the ability to set threshold voltage Vt with enhanced precision. The exemplary DDC transistor 100 includes a gate electrode 102, source 104, drain 106, and a gate dielectric 128 positioned over a substantially undoped channel 110. Lightly doped source and drain extensions (LDD or SDE) 132, positioned respectively adjacent to source 104 and drain 106, extend toward each other and set the transistor channel length.

DDC transistor 100 is shown as an N-channel transistor having a source 104 and drain 106, made of N-type dopant material, formed upon a substrate such as a P-type doped silicon substrate providing a P-well 114 formed on a substrate 116. In addition, the N-channel DDC transistor in FIG. 1 includes a highly doped screening region 112 made of P-type dopant material and a threshold voltage set region 111 made of P-type dopant material. Substantially undoped channel 110 is preferably formed using epitaxially-grown silicon using a process recipe that is intended to result in undoped crystalline silicon. Although substantially undoped channel 110 may be referred to herein as the "undoped channel", it is understood that a minimum or baseline level of dopants are present due to unavoidable introduction of some foreign material during the otherwise intrinsic epitaxial process. As a general matter, the "undoped channel" preferably has a dopant concentration of less than $5\times10^{17}$ atoms/cm$^3$. However, it is desired to maintain channel 110 in an undoped state. Variations on "undoped channel" apply. For instance, undoped channel may be single-crystal silicon, silicon-carbide, silicon-germanium, germanium or other semiconductive material.

The features of DDC transistor 100 can be implemented to result in various transistor device types. Such transistor device types include, but are not limited to: P-FETs, N-FETs, FETs tailored for digital or analog circuit applications, high-voltage FETs, high/normal/low frequency FETs, FETs optimized to work at distinct voltages or voltage ranges, low/high power FETs, and low/regular/high threshold voltage transistors (i.e. low Vt, regular Vt, or high Vt—also referred to as LVt, RVt, or HVt, respectively), etc. Transistor device types are usually distinguished by electrical characteristics (e.g. threshold voltage, mobility, transconductance, linearity, noise, power), which in turn can lend themselves to be suitable for a particular application (e.g., signal processing or data storage). Since a complex integrated circuit such as, for instance, a system on a chip (SoC) may include many different circuit blocks having different transistor device types to achieve the desired circuit performance, it is desirable to use a transistor structure that can be readily fabricated to result in the various transistor device types.

A process for forming a DDC transistor may begin with forming the screening region 112. In certain embodiments, a screening region is formed by providing the substrate 116 with the P-well 114 and implanting screening region dopant material thereon. Typically, the screening region dopant material would be matched polarity-wise with the well doping. Other methods may be used to form screening region, such as in-situ doped epitaxial silicon deposition or epitaxial silicon deposition followed by ion implantation, to result in a heavily doped screening region 112 embedded a vertical distance downward from gate 102. Preferably, screening region 112 is positioned such that the top surface of the screening region is located approximately at a distance of Lg/1.5 to Lg/5 below the bottom of the gate oxide (where Lg is the gate length). The screening region is preferably formed before STI (shallow trench isolation) formation, though implementations where screening region 112 is formed after STI may be done. Boron (B), Indium (I), or other P-type materials may be used for NMOS screening region material, Arsenic (As), antimony (Sb), or phosphorous (P) or other N-type materials can be used for PMOS screening region material. Screening region 112 is considered heavily doped with a significant dopant concentration, which may range between about $5\times10^{18}$ to $5\times10^{20}$ dopant atoms/cm$^3$. Generally, if the screening region 112 dopant level is on the higher end of the range, screening region 112 can simultaneously function as a threshold voltage setting region.

Though exceptions may apply, as a general matter it is desirable to take measures to inhibit or at least control the upward migration of dopants from the screening region. All process steps occurring after the placement of screening region dopants are preferably performed within a selected thermal budget. Moreover, for those dopants that tend to migrate or for flexibility in using a higher temperature in subsequent processes, a germanium (Ge), carbon (C), or other dopant migration resistant layer can be incorporated above or within the screening region to reduce upward migration of dopants. The dopant migration resistant layer can be formed by way of ion implantation, in-situ doped epitaxial growth, or other processes.

An optional threshold voltage set region 111 is usually positioned above screening region 112. Threshold voltage set region 111 can be either adjacent to, incorporated within, or vertically offset from the screening region. In certain embodiments, threshold voltage set region 111 is formed by implanting into screening region 112, delta doping, controlled in-situ deposition, or atomic layer deposition. In alternative embodiments, threshold voltage set region 111 can be formed by way of controlled out-diffusion of dopant material from screening region 112 into an undoped epitaxial silicon layer using a predetermined thermal cycling recipe. The threshold voltage is targeted by defining a dopant concentration and thickness of the threshold voltage set region 111 suitable to achieve the threshold voltage desired for the device. Note that if the concentration of screening region 112 is sufficiently high, then such screening region 112 can simultaneously function as the threshold voltage setting region and a separate threshold voltage set region is not needed. Preferably, threshold voltage set region 111 is fabricated to be a defined distance below gate dielectric 128, leaving a substantially undoped channel layer directly adjacent to the gate dielectric 128. The dopant concentration for threshold voltage set region 111 depends on the desired threshold voltage for the device, taking into account the location of threshold voltage set region 111 relative to the gate. Threshold voltage set region 111 may have a dopant concentration between about $1 \times 10^{18}$ dopant atoms/cm$^3$ and about $1 \times 10^{19}$ dopant atoms per cm$^3$. Alternatively, threshold voltage set region 111 can be designed to have a dopant concentration that is approximately one third to one half of the concentration of dopants in the screening region 112.

The final layer of the channel is formed preferably by way of a blanket epitaxial silicon deposition, although selective epitaxial deposition may be used. The channel 110 is structured above screening region 112 and optional threshold voltage set region 111, having a selected thickness tailored to the electrical specifications of the device. The thickness of substantially undoped channel region 110 usually ranges from approximately 5-25 nm with a thicker undoped channel region 110 being used for a lower Vt device. To achieve the desired final undoped channel region 110 thickness, a thermal cycle may be used to cause an out-diffusion of dopants from the screening region 112 into a portion of the epitaxial layer to result in a portion of the as-formed epitaxial silicon having a degree of dopant concentration so that the out-diffused dopant concentration can function as a threshold voltage set region 111 with a relatively thinner undoped channel region 110. To control the degree of out-diffusion of dopants across a variety of device types, migration resistant layers of C, Ge, or the like can be utilized in selected devices. Isolation structures are preferably formed after a blanket epitaxial deposition is performed and after the channel region 110 is formed, but isolation structures may also be formed beforehand, particularly if selective epitaxy is used to form the channel region 110.

DDC transistor 100 is completed by forming a gate stack 102, which may be a polysilicon gate or a metal gate, as well as LDD 132, spacers 130, and source 104 and drain 106 structures using conventional fabrication methods, with the caveat that the thermal budget be maintained within a selected constraint to avoid unwanted migration of dopants from the previously formed screening region 112 and threshold voltage setting region 111. In conventional field effect transistors (FETs), the threshold voltage is typically set by directly implanting a "threshold voltage implant" into the channel, raising the threshold voltage to an acceptable level that reduces transistor subthreshold leakage while still allowing speedy transistor switching. The threshold voltage implant generally results in dopants permeating through the entire channel region. Alternatively, the threshold voltage ($V_t$) in conventional FETs can also be set by a technique variously known as "halo" implants, high angle implants, or pocket implants. Such implants create a localized, graded dopant distribution near a transistor source and drain that extends a distance into the channel. Both halo implants and channel implants introduce dopants into the channel, resulting in random fluctuations of dopants in the channel that can affect the actual threshold voltage for the device. Such conventional threshold voltage setting methods result in undesirable threshold voltage variability between transistors and within transistor arrays. Additionally, such conventional threshold voltage setting methods decrease mobility and channel transconductance for the device.

Screening region 112 provides a strong body amenable for receiving a body bias. A body tap 126 to the screening region 112 of the DDC transistor can be formed in order to provide further control of threshold voltage. The applied bias can be either reverse or forward biased and can result in significant changes to threshold voltage. Bias can be static or dynamic and can be applied to isolated transistors or to groups of transistors that share a common well. Biasing can be static to set threshold voltage at a fixed set point or dynamic to adjust to changes in transistor operating conditions or requirements. Various suitable biasing techniques are disclosed in pending U.S. Pat. No. 8,273,617 titled "Electronic Devices and Systems, and Methods for Making and Using the Same," the entirety of such disclosure is hereby incorporated by reference herein.

Further examples of transistor structure and manufacture suitable for use in DDC transistors are also disclosed in above-referenced U.S. Pat. No. 8,273,617, U.S. patent application Ser. No. 12/895,785 filed Sep. 30, 2010 titled "Advanced Transistors with Threshold Voltage Set Dopant Structures", by Lucian Shifren et al., U.S. Pat. No. 8,421,162 titled "Advanced Transistors with Punch Through Suppression", U.S. patent application Ser. No. 12/971,884 filed Dec. 17, 2010 titled "Low Power Semiconductor Transistor Structure and Method of Fabrication Thereof", and U.S. patent application Ser. No. 12/971, 955 filed Dec. 17, 2010 titled "Transistor with Threshold Voltage Set Notch and Method of Fabrication Thereof," the respective contents of which are incorporated by reference herein in their entirety.

As the gate length of a DDC transistor is scaled down, the thickness of the substantially undoped epitaxial layer is typically scaled down in order to maintain electrostatic control over the channel. However, for a DDC transistor structure, scaling the substantially undoped epitaxial layer thickness without scaling the depth of the LDD junction can lead to short channel control loss. In addition, not scaling the depth of the LDD junction can also lead to increased subthreshold leakage current with decreasing distance between the LDD junction and the screening region as the thickness of the substantially undoped epitaxial layer is scaled. For example, it may not be possible to satisfy a DIBL target of 100 mV/V and/or a subthreshold swing target of 100 mV/dec for a DDC transistor having a gate length of 20 nm merely by scaling the thickness of the substantially undoped epitaxial layer.

The short channel effects can be reduced on a scaled down DDC transistor if the junction depth of the source/drain extensions is scaled down as the thickness of the substantially undoped epitaxial layer is scaled. This is partly due to the fact that as the source drain junction depth is reduced, it is likely that the source-to-drain electric field lines will couple, resulting in enhanced short channel control and reduced short channel effects. Typically, both DIBL and subthreshold swing decrease as the junction depth of the source drain extensions is reduced. For example, a target DIBL of 100 mV/V and a target subthreshold swing of 100 mV/dec can be satisfied for a DDC transistor having a gate length of 20 nm by scaling the junction depth of the source drain extensions to 5 nm in addition to scaling the thickness of the substantially undoped epitaxial layer to 5 nm.

However, the resistance of the LDD region increases exponentially as the LDD junction depth Xj is scaled down and, therefore, can become a bottleneck for delivering high drive currents that impact the electrical performance of the transistor. As shown in FIG. 2A, in one embodiment, there may be a starting point DDC transistor 200 having a deep source 210 and drain 212 and source/drain extension regions 210-T, 212-T adjacent to a gate 205. DDC transistor 200 may include an anti-punchthrough region 219 that sits preferably adjacent to and below a screening region 217 which in turn preferably sits adjacent to and below a threshold voltage set region 215, all of which are separated from gate 205 by an undoped silicon layer. In FIG. 2B, an alternative DDC transistor 202 is provided having a deep source 230 and drain 232 which have greater vertical distance compared to the source 210 and drain 212 structures in FIG. 2A. DDC transistor 202 is also shown to have an anti-punchthrough region 239 that sits preferably adjacent to and below a screening region 237 which in turn preferably sits adjacent to and below a threshold voltage set region 235, all of which are separated from a gate 225 by an undoped silicon layer. DDC transistor 202 is also shown as having raised source/drain extension regions 230-T, 232-T adjacent gate 225. Raised source/drain extension regions 230-T, 232-T may be a certain percent thicker than standard, on the order of 20%-100% thicker depending on the desired electrical characteristics afforded by the effect of raising and thickening the source/drain extension regions 230-T, 232-T so as to effect a desired junction depth while at the same time physically scaling the overall transistor dimensions. Raised source/drain extension regions 230-T, 232-T may be formed in a number of different ways including, but not limited to, a) forming initial source/drain extension regions 210-T, 212-T using standard ion implantation techniques and forming raised source/drain extension regions 230-T, 232-T by adding thickness to the initial source/drain extension regions 210-T, 212-T by epitaxial deposition of silicon; b) forming an embedded gate structure as more fully described in reference to FIG. 8 and forming in effect "raised" source/drain extension portions around the embedded gate structure; or c) other methods. Doping of source/drain regions can be accomplished by introducing dopants by way of ion implantation, by using doped epitaxially deposited material, or combinations thereof. Raised source/drain extension regions 230-T, 232-T may be dimensioned such that a bottom corner 227 of gate 225 is located so that approximately an equal amount of source/drain extension portion extends vertically downward from the bottom corner 227 of gate 225 as extends vertically upward from the bottom corner 227 of gate 225 so that, in effect, approximately one-half of the volume or one-half of the vertical thickness of source/drain extension regions 230-T, 232-T is above the bottom corner of gate 225. Raised source/drain extension regions 230-T, 232-T may be achieved by using raised doped epitaxially deposited material to effectively reduce the parasitic resistance of source/drain extension regions 230-T, 232-T. By scaling the source/drain extension portion in the upward direction and increasing its thickness while maintaining a similar shallow depth for the junction, a reduced-resistance source/drain extension region defining a gate length for gate 225 can be provided. When combined with a screening region 237 and threshold voltage set region 235, the off-state leakage current that may otherwise be encountered with DDC transistor 200 can be reduced when a raised source/drain extension regions 230-T, 232-T is used. As indicated by FIGS. 2A and 2B, though not drawn to scale, a DDC transistor 202 can be implemented having reduced off-state leakage current when the substantially undoped silicon depth can be kept about the same while the source/drain extension regions 230-T, 232-T and adjacent deep source 230 and drain 232 are raised by an amount of about 20% to 100% compared with the vertical thickness of source/drain extension regions 210-T, 212-T of DDC transistor 200.

Figure 3:
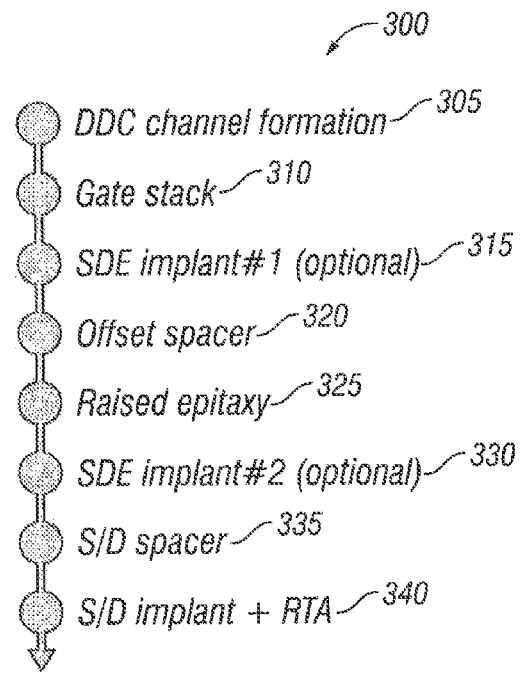
FIG. 3 illustrates one embodiment of a process flow for manufacturing DDC transistors having raised epitaxial LDD regions.
Figure 4A:
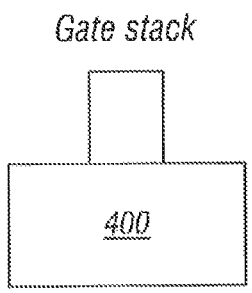
FIGS. 4A-4F show exemplary cross-sectional views of a DDC transistor as it proceeds through fabrication in a process flow substantially as provided in FIG. 3.
Figure 4B:
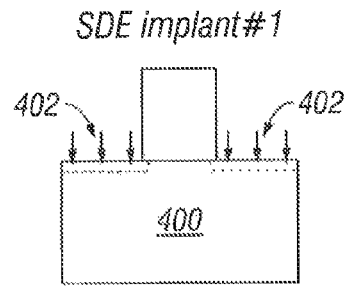
Figure 4C:
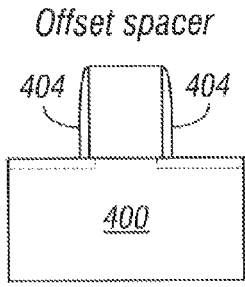
Figure 4D:
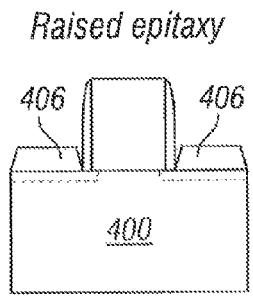

FIG. 3 illustrates one embodiment of a process flow 300 for manufacturing DDC transistors having raised epitaxial LDD regions, also known as source/drain extension regions, for an exemplary advanced process node such as 28 nm or 20 nm process technology. FIGS. 4A-4F show an exemplary resulting structure after various process steps of the process flow 300. Starting from the DDC channel stack formation previously described with reference to FIG. 1 (step 305), the gate stack is deposited and patterned at step 310. FIG. 4A illustrates a cross sectional representation of a partially fabricated DDC transistor (screening region, etc. not shown) with a patterned gate stack after step 310. At step 315, a first shallow LDD implant can be optionally performed (junction depth after full processing should be ~10-15 nm) using, for instance, ion implantation with conventional process conditions. FIG. 4B illustrates a cross sectional representation of a partially fabricated DDC transistor after optional LDD implant 402 of step 315. At step 320, a narrow offset spacer is fabricated using conventional deposition and etch back (its width should be preferably smaller than ~10 nm in order to minimize parasitic resistance). FIG. 4C illustrates a cross sectional representation of the partially fabricated DDC transistor after the narrow offset spacer 404 has been formed in accordance with step 320. At step 325, a raised LDD doped layer may be epitaxially grown (with a thickness in the range of 5 to 20 nm). FIG. 4D illustrates a cross sectional representation of the partially fabricated DDC transistor after the raised LED 406 doped epitaxial layer has been formed in accordance with step 325. The raised LDD doped epitaxial layer is preferably doped silicon, though other semiconductor materials can also be used (e.g., SiGe, SiC) with appropriate doping levels based on the device electrical specifications. In certain embodiments, the raised LDD epitaxial layer can be either undoped as grown, or in-situ doped with n-type or p-type dopant species, the dopant polarity being selected depending on whether the device is NMOS or PMOS. In the case of in-situ doped LDD epitaxial layer 406, two separate LDD epitaxial layers may be formed—one for NMOS (in-situ doped n-type LDD epitaxial layer) and one for PMOS (in-situ doped p-type LDD epitaxial layer) at different steps. If two separate LDD epitaxial layers are formed for respective NMOS and PMOS DDC transistors, masking layers are used to protect the complimentary devices during the formation of the respective LDD epitaxial layers 406. The doping concentration of the raised LDD epitaxial layer is selected to be sufficiently high in order to reduce the source/drain parasitic resistance. LDD epitaxial layer dopant concentration may be approximately in the range of about $5 \times 10^{19}$ to $8 \times 10^{20}$ atoms/cm$^3$.

Figure 4E:
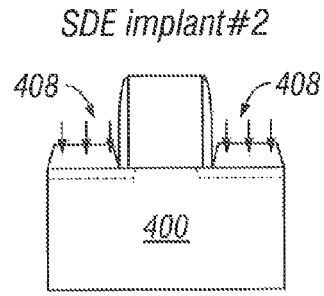

In embodiments that form an undoped LDD epitaxial layer 406, the undoped LDD epitaxial layer may be grown simultaneously on both the NMOS and PMOS DDC transistors. In this case, a second LDD ion implantation may be performed at step 330 to dope the newly deposited LDD epitaxial layer 406 to the desired dopant concentration level. FIG. 4E illustrates a cross sectional representation of the partially fabricated DDC transistor after additional implantation of dopants is performed to create raised doped source/drain extensions 408. The additional implantation can be done either by conventional beamline implantation or by other doping techniques (e.g., plasma doping, solid-source doping). Implantation conditions and materials for that step can be: for NMOS, Arsenic (As) with energy in a range of 1-5 keV and dose in a range of 1e14-5e15 atoms/cm$^2$; for PMOS, Boron (B) with energy in a range of 0.5-2 keV and dose in a range of 1e14-1e15 atoms/cm$^2$. Other dopant species effecting N-type or P-type, including combinations of dopant species within a given polarity, and other implant conditions can be used for this LDD implant step. For instance, an additional option for PMOS LDD may include Indium. Other options for NMOS LDD may include Phosphorous or Antimony. Similar materials options hold for the source/drain regions.

Figure 4F:
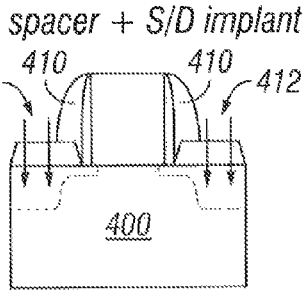

At step 335, a second spacer may be deposited to set up the appropriate mask for forming the deep source/drain regions. This second spacer is formed using a deposition and etch back process along the lines of the first spacer, but may be of a different material (for instance, combinations of silicon nitride, silicon oxy nitride, or silicon oxide layers for either the second spacer or first spacer). The second spacer may be wider than the first spacer in order to space the deep source/drain away from the channel region and prevent the deep source/drain from encroaching into the channel region. The second spacer may have a width in a range of 15-25 nm. FIG. 4F illustrates a cross sectional representation of the partially fabricated DDC transistor after second spacer 410 has been formed. At step 340, the deep source/drain regions are formed followed by a dopant activation anneal. FIG. 4F also illustrates a cross sectional representation of the partially fabricated DDC transistor after the deep source/drain regions 412 and the dopant activation anneal have been performed. Note that deep source/drain regions 412 may be formed by way of etch and epitaxial deposition fill (which epitaxial fill may be performed with in-situ doping or post-deposition doping diffusion), ion implantation, or combinations thereof.

Note that this device architecture & flow illustrated in FIG. 3 and FIGS. 4A-4F are applicable for all possible gate-stack integration scheme options, for instance: Poly/SiON and High-K/Metal-Gate using either the 'Gate-First' or 'Gate-Last' integration scheme. Also, the ordering of process steps is not limited to that described in FIG. 3 and FIGS. 4A-4F. For instance, the DDC channel formation step 305 can be performed at a different step in the sequence, for instance, after the source and drain regions are formed, which sequence may also include using selective epitaxial growth to form the undoped channel region specific to each device.

Alternatively, if the raised LDD epitaxial layer is formed as an in-situ doped epitaxial layer, the LDD ion implantation steps may not be needed. In this case, if appropriate to achieve the final desired dopant concentration levels, an additional dopant drive-in anneal can be optionally added after the LDD epitaxial layer formation step in order to in-diffuse the dopants initially contained into the LDD epitaxial layer into the substrate so that a low resistance contact is made with the channel of the device. In this case, a typical anneal would be in a temperature range of 900-1000° C. with a duration in a range of 0.1-5.0 seconds. The thermal budget should remain still low enough so that the dopants already in the substrate (i.e., the dopants in the threshold voltage set region and the screening region) do not excessively diffuse up into the substantially undoped channel region.

The raised LDD device architecture presents some additional functional advantages compared to a DDC architecture without raised tips. Enhanced scaling of the LDD junction depth Xj (with respect to the channel level) can be tolerated with minimal parasitic resistance. This scaled LDD junction depth provides superior short channel control of the device and, therefore, can enable a reduction of the dopant concentration for the threshold voltage set region and/or the screening region. As such, lower implant dose for the threshold voltage set region and screening region can be used to fabricate a DDC transistor with a given target performance. Reduced dopant concentrations for the screening region in particular can lead to reduced junction leakage currents.

Figure 5A:
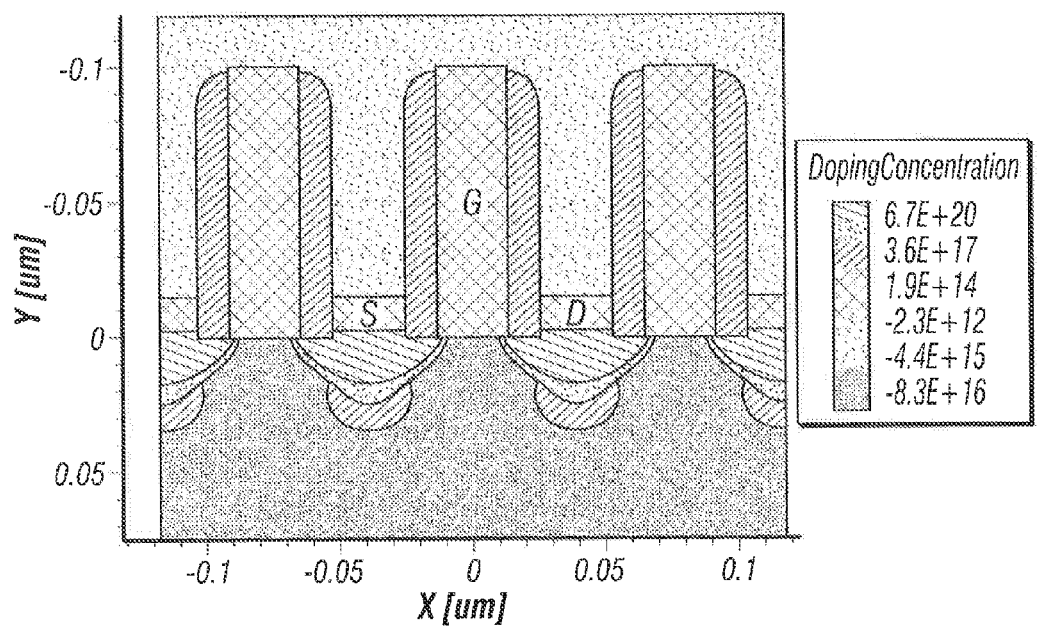
FIGS. 5A-5D illustrate in cross-sectional view various embodiments of a DDC transistor having different source drain structures and different channel doping profiles with a dopant profile comparison.
Figure 5B:
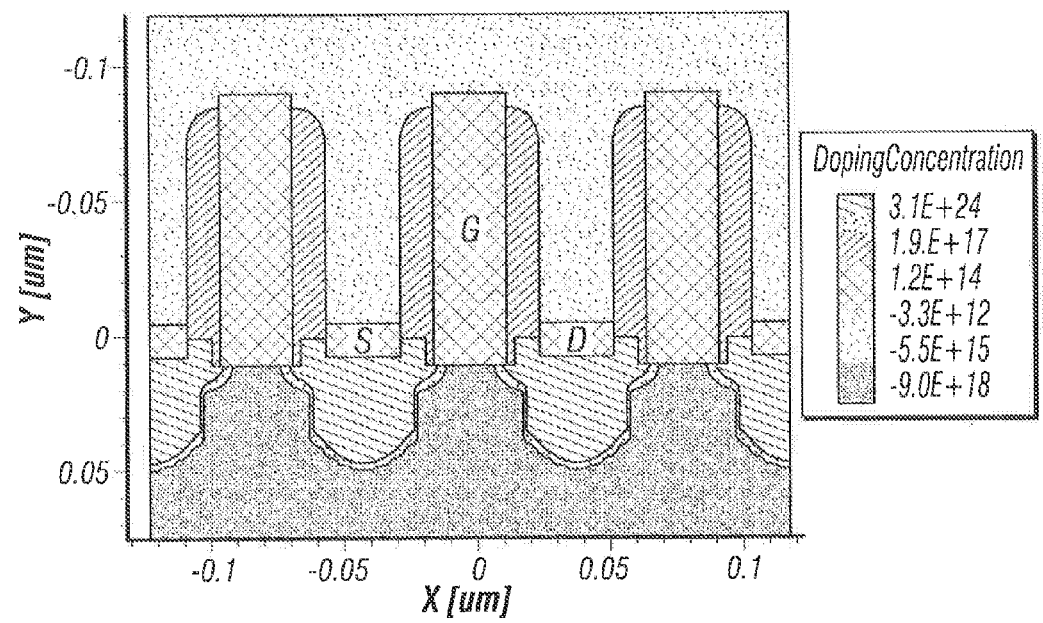
Figure 5C:
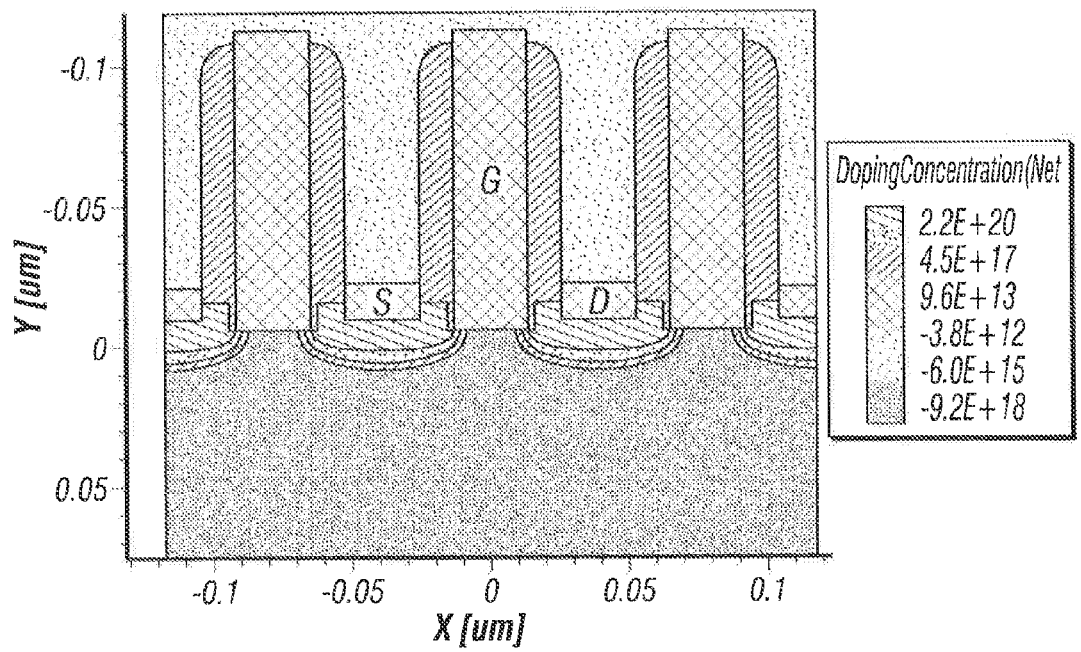
Figure 5D:
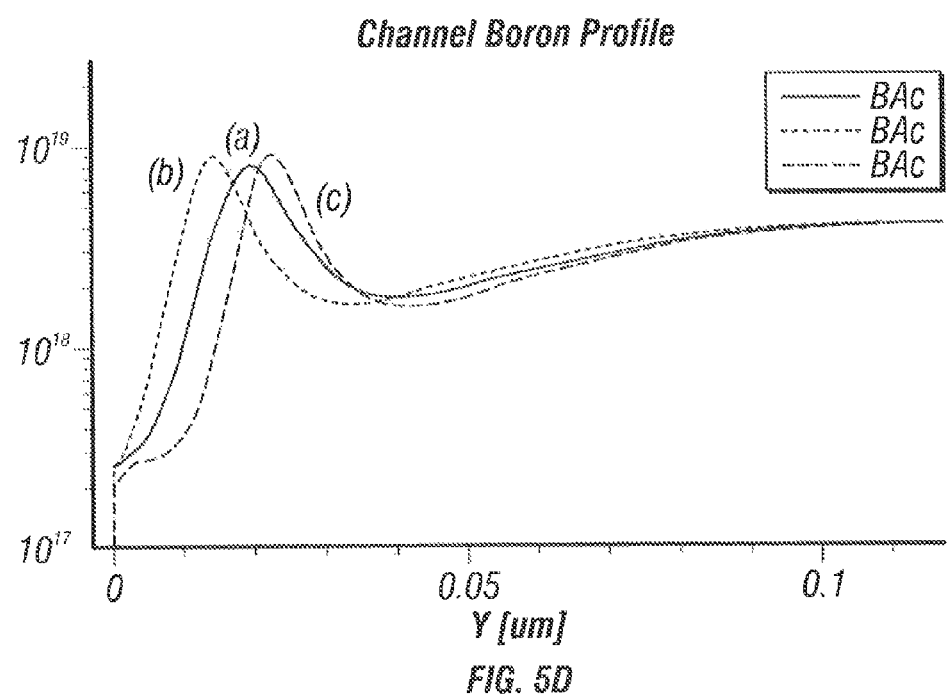

FIGS. 5A-5C illustrate three embodiments of a DDC transistor having different source drain structures and different channel doping profiles. FIG. 5D illustrates the channel dopant profile curve for these embodiments. FIG. 5A illustrates a DDC transistor embodiment that does not have raised LDDs and the corresponding channel dopant profile is illustrated as the curve labeled (a) in FIG. 5D.

FIG. 5B illustrates a DDC transistor embodiment with deep diffused source/drain regions and raised LDDs. The LDD implant step is not performed for this particular embodiment. Instead, the raised LDD epitaxial layer is doped (using either an implantation step or by forming an in-situ doped epitaxial layer) and an additional dopant drive-in anneal step is performed to drive in the dopants initially contained in the raised LDD epitaxial layer into the substrate so that a low resistance contact can be made with the channel of the DDC transistor. In this case, an anneal may be in a temperature range of about 800-1050° C. having a duration in a range of about 0.1-30 seconds. The dopant drive-in anneal can also be a flash anneal or a laser anneal in a temperature range of about 1100-1300° C. The thermal budget of the dopant drive-in anneal step should be sufficiently low to reduce the migration of dopants from the screening region and threshold voltage set region into the substantially undoped channel region. The curve labeled (b) in FIG. 5D illustrates the channel dopant profile for this embodiment. In various embodiments of this DDC transistor, the thickness of the substantially undoped epitaxial layer may be approximately in a range of 5-35 nm, the screening region may be formed by implanting dopants at an energy of about 2-12 keV and at a dose of about $1.1 \times 10^{13}$ atoms/cm$^2$, the LDD epitaxial layer doping concentration may be approximately in a range of $5 \times 10^{19}$-$5 \times 10^{20}$ atoms/cm$^3$, and the source/drain doping concentration may be approximately in a range of $1 \times 10^{20}$-$5 \times 10^{21}$ atoms/cm$^3$.

FIG. 5C illustrates a DDC transistor embodiment with shallow diffused source/drain regions and raised LDDs. The LDD implant and the deep source drain implant steps are not performed for this embodiment. Instead, the raised LDD epitaxial layer is doped (using either an implantation step or by forming an in-situ doped epitaxial layer) and an additional dopant drive-in anneal step is performed to drive in the dopants initially contained in the raised LDD epitaxial layer into the substrate to form shallow diffused source/drain regions and diffused LDDs in the substrate. In this case, an anneal may be in a temperature range of about 800-1050° C. having a duration in a range of about 0.1-30 seconds. The dopant drive-in anneal can also be a flash anneal or a laser anneal in a temperature range of about 1100-1300° C. The thermal budget of the dopant drive-in anneal step should be sufficiently low to reduce the migration of dopants from the screening region and threshold voltage set region into the substantially undoped channel region. The curve labeled (c) in FIG. 5D illustrates the channel dopant profile for this embodiment. In various embodiments of this DDC transistor, the thickness of the substantially undoped epitaxial layer may be approximately in a range of 5-35 nm, the screening region may be formed by implanting dopants at an energy of about 2-12 keV and at a dose of about $1.1 \times 10^{13}$ atoms/cm$^2$, the LDD epitaxial layer doping concentration may be approximately in a range of $5 \times 10^{19}$-$5 \times 10^{20}$ atoms/cm$^3$, and the source/drain doping concentration may be approximately in a range of $1 \times 10^{20}$-$5 \times 10^{21}$ atoms/cm$^3$. In certain embodiments, the thermal budget for the dopant drive-in anneal step is set to a predetermined value that reduces overlap between the diffused source/drain region dopant profile and the screening region dopant profile after the drive-in anneal step in order to reduce the leakage current of the DDC transistor. Typically, the dopant concentration of the diffused source drain and the dopant concentration of the screening region are approximately in a range of $1 \times 10^{17}$-$1 \times 10^{19}$ atoms/cm$^3$ in the region where these two dopant profiles overlap. In each of the three DDC transistor embodiments of FIGS. 5A-5C, for simplicity purposes in the device, modeling, a separate threshold voltage set region is not contemplated.

Table I shows the modeled Idsat, Ioff, Ieff, and RDF (random dopant fluctuation), for the three embodiments of FIGS. 5A-5C. Table II shows the modeled subthreshold swing (SS) and DIBL (drain induced barrier lowering) for the three embodiments of FIGS. 5A-5C. Modeling was done using TCAD device modeling tools. Table I shows that the DDC transistor embodiment with shallow diffused source/drain and diffused (raised) LDDs has the lowest RDF among the three embodiments and it has a higher Ieff than the DDC transistor embodiment with deep diffused source drain and diffused LDD. Table II shows that the DDC transistor embodiment with shallow diffused source/drain and diffused (raised) LDDs has the lowest DIBL among the three embodiments.

TABLE I

| DDC structure | Idsat (amp/μm) | Ioff (amp/μm) | Ieff (amp/μm) | RDF (mV) |
|---|---|---|---|---|
| Implanted LDD (a) | $9.07 \times 10^{-4}$ | $2.3 \times 10^{-10}$ | $4.03 \times 10^{-4}$ | 4.47 |
| Diffused LDD Deep diffused S/D (b) | $8.93 \times 10^{-4}$ | $2.3 \times 10^{-10}$ | $3.92 \times 10^{-4}$ | 4.87 |
| Diffused LDD Shallow diffused S/D (c) | $8.73 \times 10^{-4}$ | $2.4 \times 10^{-10}$ | $3.97 \times 10^{-4}$ | 3.59 |

TABLE II

| DDC structure | SS (mV/dec) | DIBL (mV/V) |
|---|---|---|
| Implanted LDD (a) | 78 | 62.67 |
| Diffused LDD, Deep diffused S/D (b) | 78 | 65.33 |
| Diffused LDD, Shallow diffused S/D (c) | 84 | 56.00 |

According to the above tables, the DDC transistor embodiment with shallow diffused source/drain can have an enhanced Ieff and comparable Ioff for a given value of Ioff as compared to the DDC transistor embodiment with deep diffused source/drain. The DDC transistor embodiment with shallow diffused source/drain can also have lower subthreshold swing and DIBL compared with the embodiment with deep diffused source/drain.

The parasitic resistance of the LDD region can be further reduced and the performance of the DDC transistor can be further enhanced by increasing the dose for the LDD implant. The maximum dose that may be used for the LDD implant may be limited by device degradation resulting from increased short channel effects as the LDD implant dose is increased. In one embodiment of the DDC transistor, the short channel effects resulting from increased LDD implant dose are reduced by performing a Ge preamorphization implant (PAI) in the LDD implant region channel portion, which may be done prior to or after the formation of the LOU doped regions. The Ge PAI is carried out by performing an ion implantation to embed Ge into the undoped channel structure, where the dose of the Ge may be determined experimentally and the energy is selected to result in the Ge portion of the otherwise undoped channel structure extending a limited distance into the channel from the top surface or extend through the vertical distance of the channel. The Ge PAI may be performed before or after the DDC doped regions are formed. An advantage to performing the Ge PAI before the DDC doped regions are formed is that if a high temperature anneal is performed to recrystallize the silicon, the high temperature step(s) may be done before the screening region and optional threshold voltage set region are formed. If the Ge preamorphization is performed after the DDC doped regions are formed, then care should be taken to keep to within a thermal budget that avoids unwanted out-diffusion of dopants from the DDC doped regions. Exemplary dose and energy for the Ge preamorphization may be about $1 \times 10^{11}$-$5 \times 10^{13}$ atoms cm$^2$ at an energy of about 1-16 keV, resulting in a desired Ge concentration that may be on a par with the concentration of the LDD dopants or may be about an order of magnitude less concentrated. Exemplary anneal conditions may include a temperature range of 550-900° C. for approximately 10-100 seconds, a flash anneal, or combinations thereof.

Figure 6A:
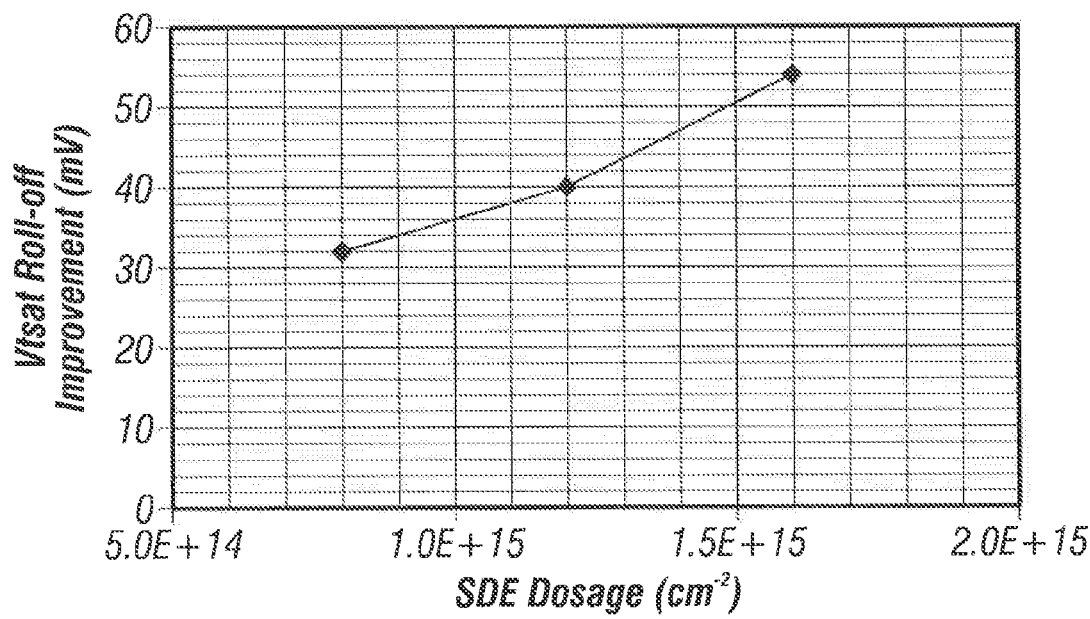
FIGS. 6A-6B illustrate Vt roll-off difference and DIBL difference for exemplary DDC transistors with and without Ge PAI in the LDD implant region.
Figure 6B:
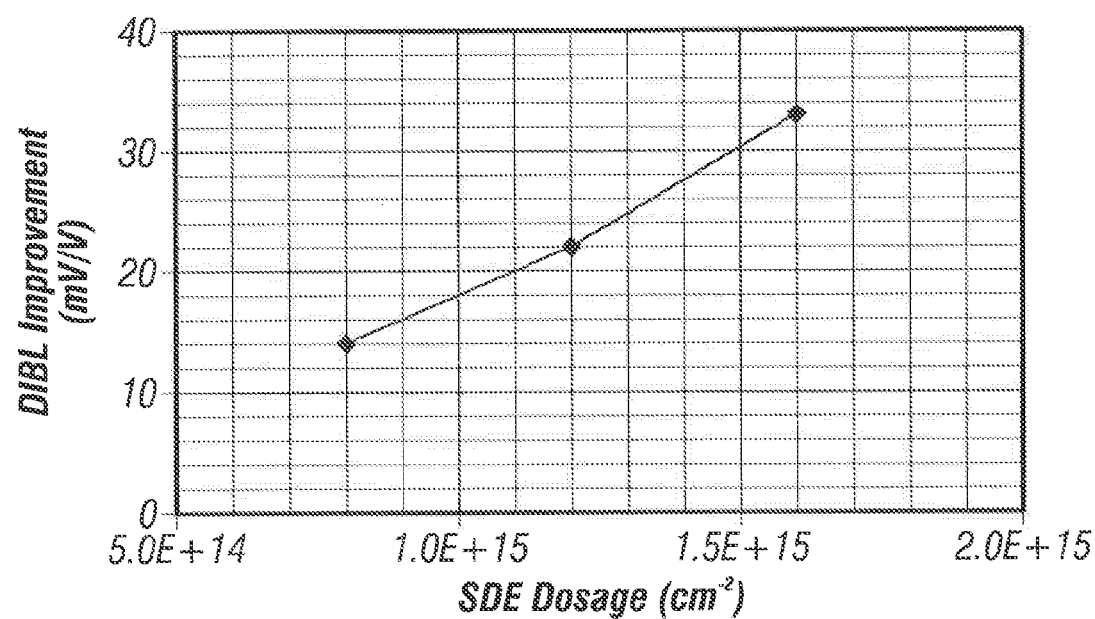

FIGS. 6A-6E illustrates the improvement in Vt roll-off as measured by the difference in Vt roll-off between a DDC transistor with Ge PAI in the LDD implant region channel portion and a DDC transistor without the Ge PAI, where Vt roll-off is calculated as the difference between the threshold voltage (Vtsat) for a DDC transistor having a gate length (Lg) of 1 μm and a DDC transistor having a gate length (Lg) of 30 nm. FIG. 6A illustrates that with Ge PAI in the LDD implant region channel portion, Vt roll-off improves with increasing LDD implant doses. FIG. 6B illustrates DIBL improvement for DDC transistors having a gate length of 30 nm with and without Ge PAI implants in the LDD implant region. This figure shows that DIBL improves with Ge PAI in the LDD implant region, particularly at higher LDD implant doses.

Figure 7:
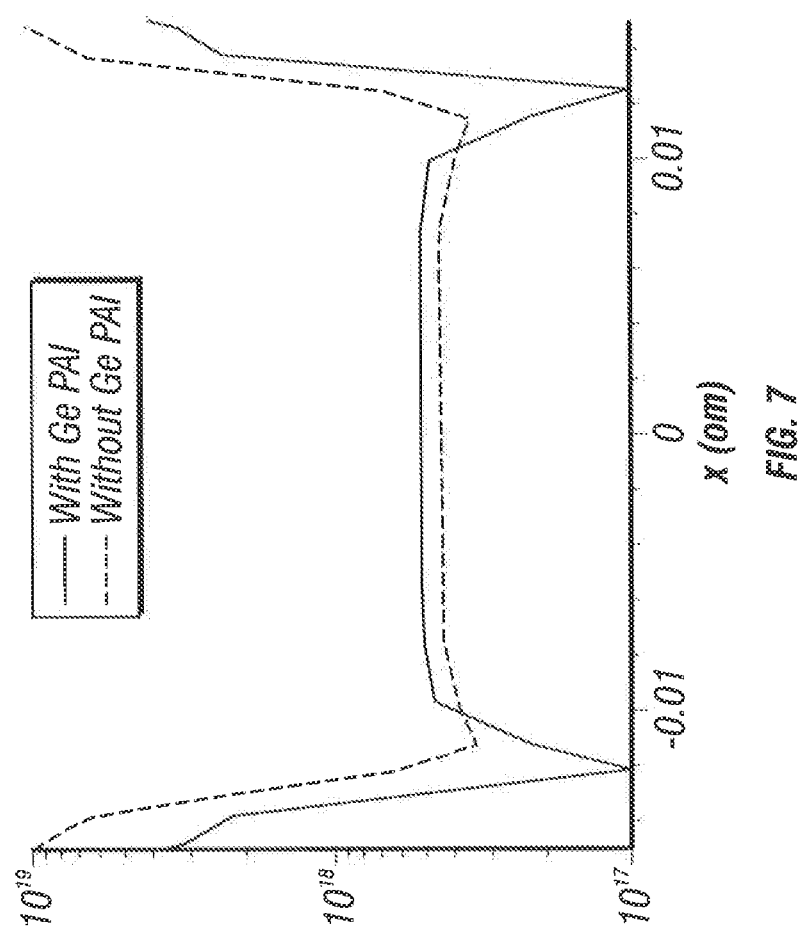
FIG. 7 illustrates a lateral net doping profile of DDC transistors with and without Ge PAI to effect a change in effective channel length.

In addition to reducing short channel effects, performing Ge PAI in the LDD implant region can also provide an increase in the effective channel length of the DDC transistor. The effective channel length for a transistor with Ge PAI in the LDD implant region can be increased by approximately 1 nanometer more than a transistor with no Ge PAI in the LDD implant region. In effect, the Ge PAI causes the LDD to be pushed apart. FIG. 7 illustrates a lateral net doping profile of DDC transistors with and without Ge PAI showing the increase in effective channel length achieved by Ge PAI in the LDD implant region. This increase in effective channel length also contributes to improved DIBL characteristics for DDC transistors with Ge PAI in the LDD implant region.

Figure 8A:
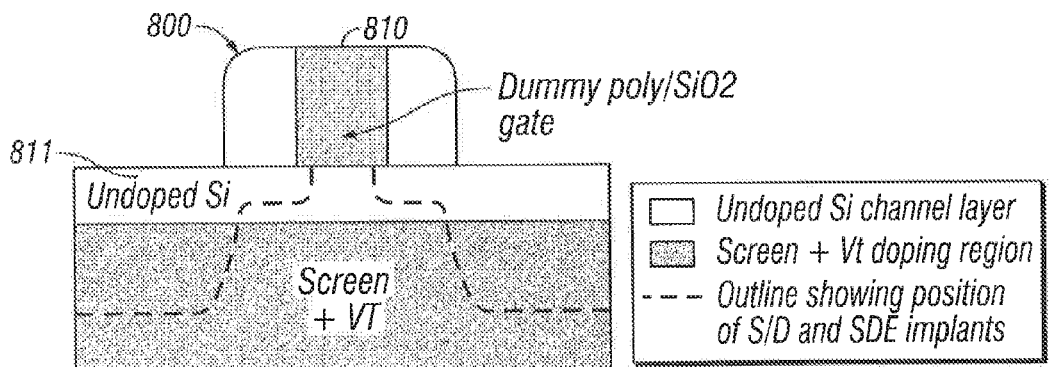
FIGS. 8A-8C illustrate steps of an exemplary process for fabricating a DDC transistor having a recessed gate structure.
Figure 8B:
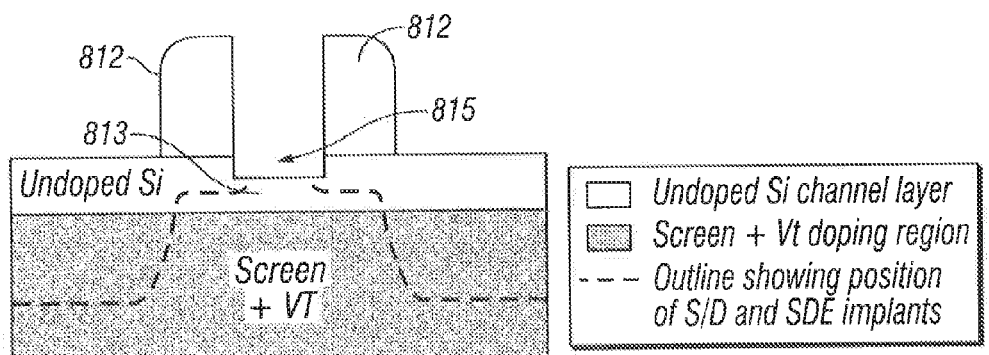
Figure 8C:
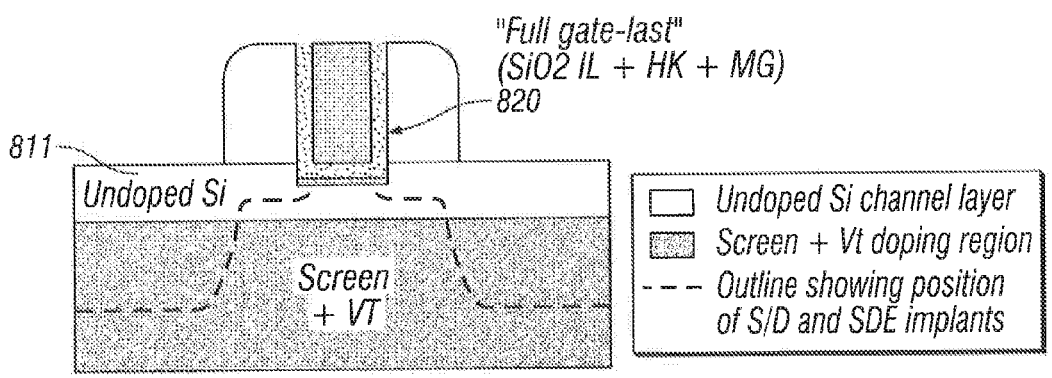

In an alternative embodiment of a DDC transistor, the LDD junction depth is scaled while minimizing the parasitic resistance of the LDD region by using a recessed gate structure. In effect, the recessed gate structure brings the bottom portion of the gate down relative to the LDD region, so that the LDD region extending off the bottom of the gate is scaled down. FIGS. 8A-8C illustrate the resulting structure after various process steps of a process flow for fabricating a DDC transistor having a recessed gate structure. FIG. 8A illustrates a cross sectional representation of a partially fabricated DDC transistor 800 after a polysilicon dummy gate 810 and sidewall spacers have been formed. A pre-scaled LDD structure 811 is formed using conventional methods. FIG. 8B illustrates a cross sectional representation of the partially fabricated DDC transistor after the dummy gate is removed with the spacers 812 remaining and a recess 815 is formed in the substantially undoped channel region. Recess 815 can be formed by performing an additional etch after removal of dummy gate 810 to deliberately etch a vertical distance down into the undoped channel 813. The additional etch may be performed using a wet etch effective to etch a controlled amount of silicon, by plasma dry etch, or a combination thereof. The amount of vertical etch is determined based on the desired dimensions of the pre-formed LDD structure 811, for instance, an amount that may be 2 nm to 8 nm into the undoped channel 813. FIG. 8C illustrates a cross sectional representation of the partially fabricated DDC transistor after a high-k gate dielectric and metal gate structure has been formed in the recess 820.

Though not shown in the figures, halo implants can also be used in combination with the techniques and embodiments described above to further adjust the threshold voltage of the DDC transistor. A DDC transistor with halo implants has enhanced short channel characteristics, such as lower leakage, DIBL, and AVt (threshold voltage variation), as compared to a conventional transistor with halo implants for equivalently sized transistors in terms of length and width. The process flow for manufacturing DDC transistors can be augmented to add the halo implant step, preferably by performing the halo implants after using the same mask that is used for the LDD implant step. Therefore, the halo implants can be added to the DDC process flow without any additional masking steps.

The halo implant dose can modify the threshold voltage of the DDC transistor, thereby allowing still another method to obtain a target threshold voltage in addition to the screening region dopant concentration and thickness, substantially undoped channel layer thickness, and threshold voltage set region dopant concentration and thickness described above. For example, different combinations of screening region implant dose and halo implant dose can be used to obtain a target threshold voltage. In one embodiment, the low halo implant dose may be approximately in a range of $5 \times 10^{12}$-$2 \times 10^{13}$ atoms/cm$^2$ and the high halo implant dose may be approximately in a range of $1 \times 10^{13}$-$4 \times 10^{13}$ atoms/cm$^2$. A benefit of using some degree of halo doping is to be able to reduce the screening region implant dose and thereby reduce the leakage current.

Figure 9A:
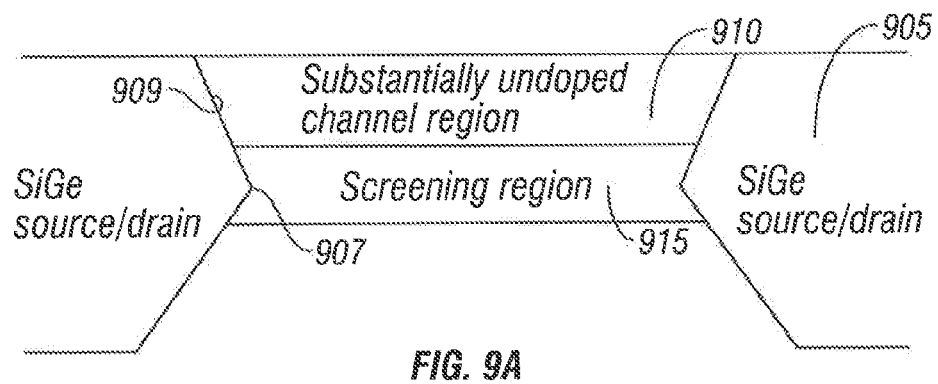
FIGS. 9A-9D illustrate an exemplary DDC transistor structure channel portion with different source/drain shapes and specially placed screening region relative thereto in addition to a trend for resulting threshold voltage with variation of screen implant dose.

Further reduction in the subthreshold leakage current can be obtained for DDC transistors having embedded SiGe source/drain by locating the screening region at approximately the same depth as a source/drain structure projection, such that the peak dopant concentration of the screening region is substantially aligned with the location of the source/drain structure projection. This technique can provide reduced subthreshold leakage current for PMOS DDC transistors having various source/drain structures including SiGe source/drain structures as well as NMOS DDC transistors having various source/drain structures including SiGe source/drain structures. FIG. 9A illustrates one embodiment of a DDC transistor channel portion having a substantially undoped channel region 910 and a SiGe source/drain structure 905. SiGe source/drain structure 905 is typically formed using a conventional wet etch process to etch away regions in the silicon substrate, whereupon selective epitaxial growth which may further be combined with diffusion, ion implantation, or combinations thereof to form the doped filling to create the SiGe source/drain 905. SiGe source drain 905 includes a diamond shaped projection 907 and the screening region 915 peak concentration portion is located to be substantially aligned with the location of the diamond shaped projection 907 of SiGe source/drain 905. An upper portion 909 of the SiGe source/drain 905 serves to locate a region for the source/drain extension, if any.

It is desirable to satisfy a target subthreshold leakage current in addition to the DDC transistor design meeting the specification for threshold voltage. The threshold voltage of the DDC transistor can be set to a target value, based on the thickness of the substantially undoped channel region 910 and the dopant concentration and placement of screening region 915. As represented in FIG. 9A, the laterally extending, substantially flat screening region 915 (which may be achieved using a substantially uniform ion implantation process) is shown to be located at the projection 907 vicinity to provide threshold voltage control while at the same time avoiding excessive junction leakage. Screening region 915 preferably has a finite thickness that is about 3 nm to 40 nm or more, depending on desired characteristics for protecting against junction leakage while serving to set the threshold voltage. Thickness of screening region 915 also depends on whether there is an anti-punchthrough region therebelow (not shown); a thinner screening region 915 may be used if a thicker anti-punchthrough region is used. Note that the dopant concentration in the screening region depends on the ion implant dose used when implanting the screening region and, therefore, the implant dose can be set to a predetermined value such that the target threshold voltage is realized. In the example shown in FIG. 9A, a separate threshold voltage set region is not provided. In alternative embodiments, a separate threshold voltage set region may be included to increase the absolute value of the threshold voltage. In still further alternative embodiments, instead of a threshold voltage set region, light halo doped regions may be used.

Figure 9B:
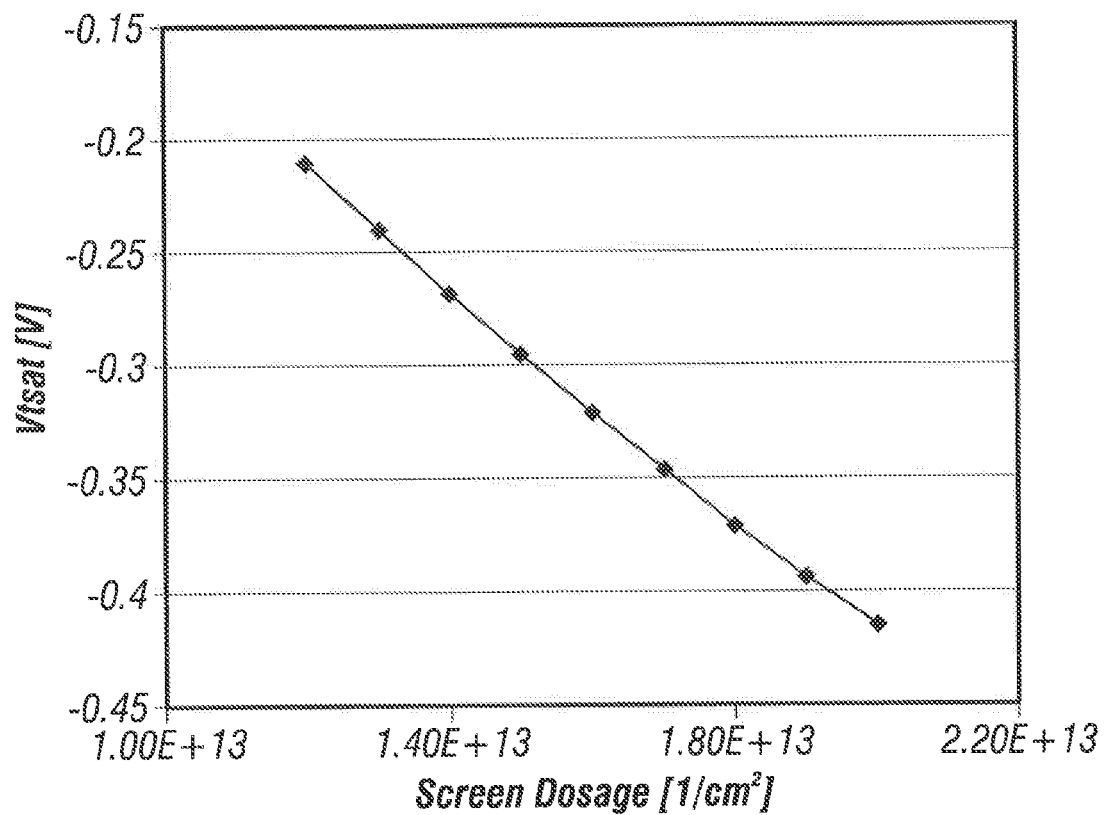

FIG. 9B shows that as a general matter, with a higher screen implant dose, a greater absolute value of the threshold voltage is realized. The implant energy used to implant the screening region tends to determine the position of the screening region, with some impact from the screen implant dose as well. The main process condition to place the screening region a vertical distance down the channel, however, is the implant energy and, therefore, the implant energy should be preselected to a predetermined value that positions the screening region relative to the source and drain dimensions to satisfy a target subthreshold leakage current. Preferably, an ion implantation process that effects a substantially flat, substantially uniform (for instance, less than or equal to +/−5% variation), laterally extending screening region is used. An effective structure to reduce sub-threshold leakage current, for instance, in the case of the structure of FIG. 9A, is to position the peak screening region 915 dopant concentration in substantial alignment with the location of the SiGe projection 907 and such that the screening region 915 rests just below the upper portion 909 of the SiGe source/drain 905.

Figure 9C:
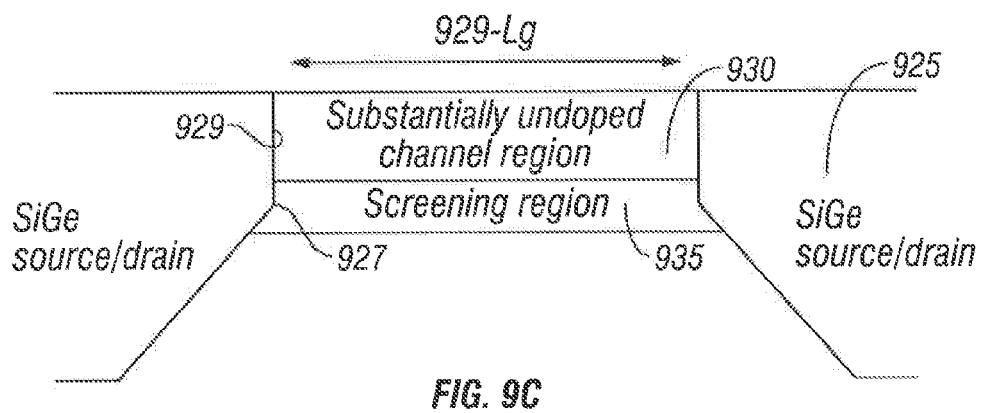

FIG. 9C illustrates an alternative embodiment of a DDC transistor channel portion with SiGe source/drain 925, whereby the LDD region formation step is eliminated but in lieu of an angled upper portion 909 as shown in FIG. 9A, the shape of the SiGe source drain 925 is modified to mimic an approximate shape of the LDD region that would have been formed if the LDD region formation step had been performed. More specifically, the upper portion 929 of the SiGe source/drain 925 is designed to be substantially vertical or, in other embodiments not shown, may be angled slightly inward into the channel to effect a desired effective gate length 929-Lg. Modification of the shape can be achieved a number of different ways, for instance by performing a two-step process for etching the source/drain region. In the first step, a plasma etch that may include reactive ion bombardment may be used to etch a trench a substantially vertical distance into the silicon. Then there may be a second step using a wet etch to carve the slanted shape that would follow the crystalline plane of the silicon while the material is etching. SiGe source drain 925 may be filled with selective epitaxial silicon with dopants introduced therein using, for instance, diffusion or separately performed ion implantation. Using a modified shape of the SiGe source drain 925 can be advantageous because the effective channel length 929-Lg is thereby increased as a result of eliminating a separately-formed LDD region and also because eliminating the separately-formed LDD region reduces the problem of potential out-diffusion of LDD region dopants into the channel region. For DDC transistor embodiments with the modified SiGe source/drain 925 shape, further reduction in the subthreshold leakage current can be obtained by locating the laterally-extending, substantially flat screening region 935 (which may be achieved by applying a substantially uniform ion implantation process, for instance less than or equal to +/−5% variation) below a substantially undoped channel region 930 at approximately the same depth as the notch 927 formed in the modified SiGe source/drain 925 as a result of the wet etch, such that the peak dopant concentration of the screening region is substantially aligned with the location of the notch 927 in the modified source drain 925. Screening region 935 preferably has a finite thickness that is about 3 nm to 40 nm or more, depending on desired characteristics for protecting against junction leakage while serving to set threshold voltage. Thickness of screening region 935 also depends on whether there is an anti-punchthrough region therebelow (not shown); a thinner screening region 935 may be used if a thicker anti-punchthrough region is used. In the example shown at FIG. 9C, a separate threshold voltage set region is not provided. In alternative embodiments, a separate threshold voltage set region may be included to increase the absolute value of the threshold voltage. In still further alternative embodiments, instead of a threshold voltage set region, light halo doped regions may be used.

Figure 9D:
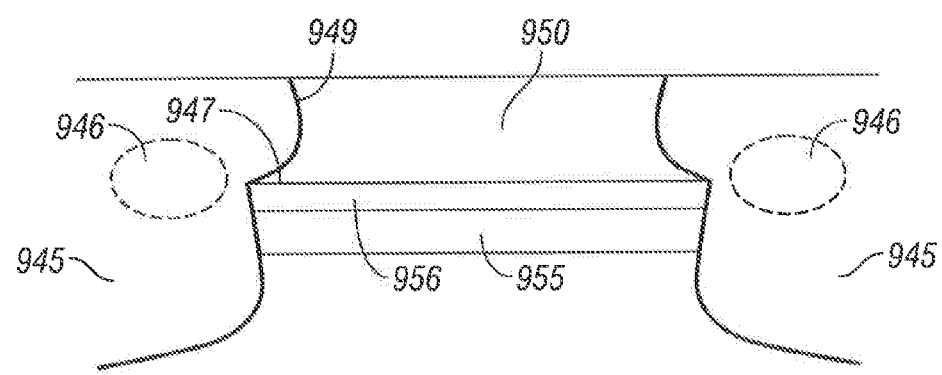

FIG. 9D is provided to illustrate a representative embodiment of a DDC transistor channel portion that uses non-SiGe source/drain structures. In the example shown at FIG. 9D, there is a source/drain extension region 949, extending inward into undoped channel portion 950 on either side, and deep source/drain regions 945. There is an interface portion 947 at an undercut of the source/drain extension region 949 and where the source/drain extension region 949 and deep source/drain 945 touch. There is a highly doped screen region 955 which, together with threshold voltage setting layer 956, extends laterally between the source/drain regions 945 and may abut the inner edges of the source/drain regions 945. Highly doped screen region 955 is separated from the substrate top surface by a substantially undoped channel portion 950 that is preferably comprised of epitaxial silicon (but other semiconductive materials such as silicon carbide, silicon germanium, germanium, or combinations thereof may be used). Note that substantially undoped channel portion 950 may contain carbon and/or germanium or other species that serve to inhibit migration of dopants from the heavily doped areas, whether to inhibit migration of dopants from the source/drain extension region 949 and/or source/drain regions 945, or highly doped screen region 955 and threshold voltage setting layer 956, or both. In FIG. 9D, a separate threshold voltage set region is provided but other embodiments may omit a separate threshold voltage set region 956. In various embodiments, a separate threshold voltage set region 956 may be included to increase the absolute value of the threshold voltage. In still further alternative embodiments, instead of a threshold voltage set region, light halo doped regions may be used.

As represented in FIG. 9D, the laterally extending, substantially flat screening region 955 (which may be achieved using a substantially uniform ion implantation process, for instance, less than or equal to, +/−5%, achievable using state of the art ion implantation tools and techniques) together with threshold voltage control set region 956 is shown to be located at the interface portion 947 vicinity to provide threshold voltage control while at the same time avoiding excessive junction leakage. The placement of the peak concentration of screening layer 955 and optional threshold voltage set region 956 is located to be high enough up the vertical length of source/drain regions 945 (toward the top of undoped channel 950) while maintaining the rule of thumb of being located at a distance Lg/1.5 to Lg/5 from the top of undoped channel 950. And, to avoid excessive junction leakage, screening region 955 is positioned to avoid being placed at the same level as heavily doped portion 946 of source/drain regions 945. Screening region 955 is instead placed to be just below the heavily doped portion 946 of source/drain regions 945. In terms of dopant concentrations, the peak concentration of screening layer 955 may be selected and located so as to be just below the vertical depth of a concentration of the source/drain regions 945 that is factor of at least 2× higher. By way of example, if the peak concentration of screening region 955 is $5 \times 10^{19}$ atoms/cm$^3$, then such peak concentration is located to be below the vertical portion of source/drain regions 945 that has a concentration of dopants at $1 \times 10^{20}$ atoms/cm$^3$. Note that the thickness of the screening region 955 typically does not extend past the bottom of the source/drain regions 945. Exemplary placements for screening region 955 may be anywhere from around the interface portion 947 to 75% of the distance down the vertical length of the source/drain regions 945 as measured starting from interface portion 947. Screening region 955 may be as thick as the length from interface portion 947 to 75% of the distance down the vertical length of the source/drain regions 945 as measured starting from interface portion 947, or may be thinner. Target dopant concentration for screening region 955 remains at preferably around $5 \times 10^{18}$ atoms/cm$^3$ to $1 \times 10^{20}$ atoms/cm$^3$, to achieve the DDC benefits of setting the depletion depth, pinning the electric field, while influencing the threshold voltage for the device (either setting the threshold voltage itself or in combination with a threshold voltage set region). Moving highly doped screening region 955 any higher up the channel may induce excessive random dopant fluctuation and inhibit short channel control. Moving highly doped screening region 955 any further down the vertical length of the channel than 75% may induce excessive subthreshold leakage. Screening region 955 preferably has a finite thickness that is about 3 nm to 40 nm or more, depending on desired characteristics for protecting against junction leakage while serving to set the threshold voltage, as well as size of the source/drain regions 945. Thickness of screening region 955 also depends on whether there is an anti-punchthrough region therebelow (not shown); a thinner screening region 955 may be used if a thicker anti-punchthrough region is used. In all source/drain configurations, source/drain regions are doped with a dopant material that electrically imparts current flow through the channel region—the dopant material is of a given polarity to define whether the transistor is an N-FET or P-FET. For instance, arsenic, phosphorous, antimony, or combinations thereof may be used for doping the source/drain regions to define an N-FET, and boron, indium, or other material of the opposite polarity from N-FET-forming material may be used to define P-FET transistor types. Doping concentrations generally are selected to be high enough to drive the desired flow of electrons or holes based upon an applied voltage. Exemplary concentrations for source/drain region are on the order of $1\times10^{20}$ to $1\times10^{21}$ atoms/cm$^3$ for the peak dopant concentration. Note further that screen region 955 and threshold voltage set region 956 are oppositely doped from the dopants forming the source/drain regions.

Further reduction in the subthreshold leakage current while maintaining against excessive junction leakage can be obtained for DDC transistors by grading the embedded SiGe source/drain regions whereby a lightly doped or substantially undoped outer region is formed around a source/drain core. FIGS. 10A-10B show an exemplary DDC transistor structures having a screening region positioned relative to respective source/drain structures. FIG. 10A illustrates a PMOS SiGe source drain structure having an outer region 1010 and a heavily doped SiGe core 1005 embedded in on either side of a substantially undoped channel region 1015. The example shown is for a PMOS source/drain structure, preferably using wet-etched holes filled with epitaxially grown Si or SiGe. The angular shape arises when a wet etch process is used, the wet etch occurring along the crystalline plane of the silicon substrate. The projected portion 1022 may extend about 10 nm to 40 nm deep, Source/drain structure 1010, 1005 depth may extend about 40 nm to 70 nm deep. The actual selected size of the source/drain structure and its depth depends on the process node and transistor design specifications. The fine-tuning of the sizing of the source/drain structure can be performed using standard TOAD modeling techniques. Outer region 1010 is shown to be disposed between core 1005 and screening region 1020, shown in the example as being aligned with projected portion 1022. There may also be an optional threshold voltage set region (not shown) disposed between screening region 1020 and the substantially undoped channel region 1015. Outer region 1010 can be doped or slightly doped on the order 2-3 orders of magnitude lower doping concentration than core 1005, or lightly doped on the order of 1-2 orders of magnitude lower doping concentration than core 1005. Outer region 1010 is preferably formed using the process used to form core region 1005, for which core region 1005 is doped using implant conditions, diffusion, or combination thereof to limit the extent of diffusion of implanted material to outer region 1010. Typically, epitaxial growth is used to fill outer region 1010 as well as core region 1005. The preferred semiconducting material is SiGe, but other materials can be used, for instance, silicon, silicon carbide, or combinations thereof. An exemplary process for forming the graded source/drain structure 1010, 1005 may be to perform a first partial fill step with undoped silicon or SiGe or with light doping followed by a fill step using epitaxial growth. Note that in still another variation, substantially undoped outer region 1010 can simply be the bulk silicon in which the source/drain structure 1010, 1005 is made, whereby screening region 1020 is in effect placed a fixed lateral distance separate from the outer edge of the source/drain structure 1010, 1005. In the case of outer region 1010 being bulk silicon, screening region 1020 would be formed using a method that results in a fixed separation distance of the outer edge of screening region 1020 from the edge of source/drain structure 1010, 1005. Such separation can be achieved using masking techniques. Substantially undoped outer is region 1010 preferably has a specified width, which may be, for instance, 1 nm to 10 nm wide. As illustrated in FIG. 10A, screening region 1020 can be positioned at approximately the sane depth as projected portion 1022 with source/drain structure 1010, 1005 providing a substantially undoped buffer to reduce the junction leakage. Though shown with a specific shape, the graded source/drain structure 1010, 1005 may have any shape including the shapes discussed above in FIGS. 9A-9C.

For a particular embodiment of the DDC transistor, a target leakage current and a target drive current are obtained by using SiGe source/drain structures having a substantially undoped SiGe layer of a predetermined thickness as an outer buffer layer, with a screening region extending to the outer edge of the outer buffer layer so that the outer buffer layer provides a separation between the screening region edge and the source/drain core portion. Exemplary materials for forming source/drain portion include doped silicon or doped silicon germanium or other material such as silicon carbide. FIG. 10B illustrates a non-wet etched source/drain region 1005-ID, for instance formed by ion implantation and diffusion. There may be a buffer layer 1005-B extending a distance from source/drain region 1005-ID to create a buffer space between source/drain region 1005-ID and a screening region 1021. Buffer layer 1005-B may be a portion of bulk silicon or may be a region formed with migration-inhibiting material such as carbon in silicon. Buffer layer 1005-B is defined to have a thickness designed to avoid excessive junction leakage that may otherwise arise due to screening region 1021 being proximate to a peak concentration source/drain portion 1005-PD in the absence of buffer layer 1005-B if screening region 1021 were instead to extend laterally all the way to source/drain region 1005-ID. Buffer layer 1005-B may be bulk silicon, may be comprised of dopant-migration inhibiting material, or may be doped to a degree, either of the same dopant polarity as source/drain region 1005-1D but with a reduced concentration, for instance about 2 orders of magnitude lesser concentration. Buffer layer 1005-B may be formed by angled ion implantation to impart a limited concentration of dopants or to impart germanium, carbon, or other semiconductive and/or dopant migration-inhibiting material. The scheme of providing a heavily doped core region in combination with a lesser doped outer buffer layer to serve as an interface between the heavily doped core region and the edge of the screening region applies to various source/drain structures including shallow junction, raised source/drain, epitaxially grown source/drain, and implanted/diffused source/drain structures. These source/drain structures may also take on any desired shape while still providing the buffering between the screening region and the core region.

Figure 11A:
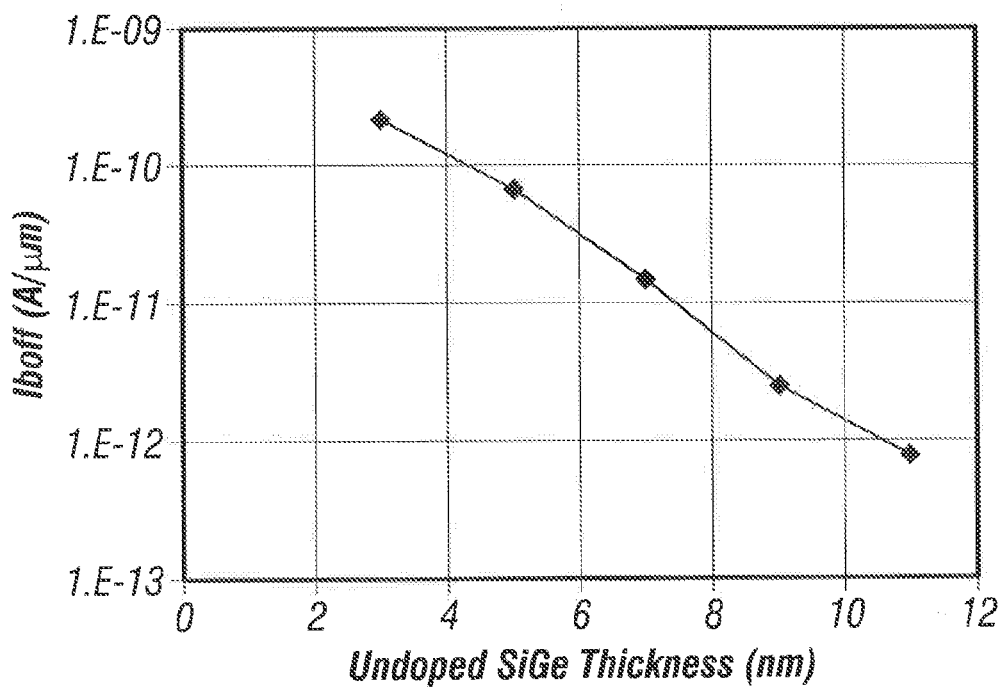
FIGS. 11A-11B illustrate effects of the undoped SiGe layer thickness on the subthreshold leakage current of exemplary DDC transistors in accordance with certain embodiments.
Figure 11B:
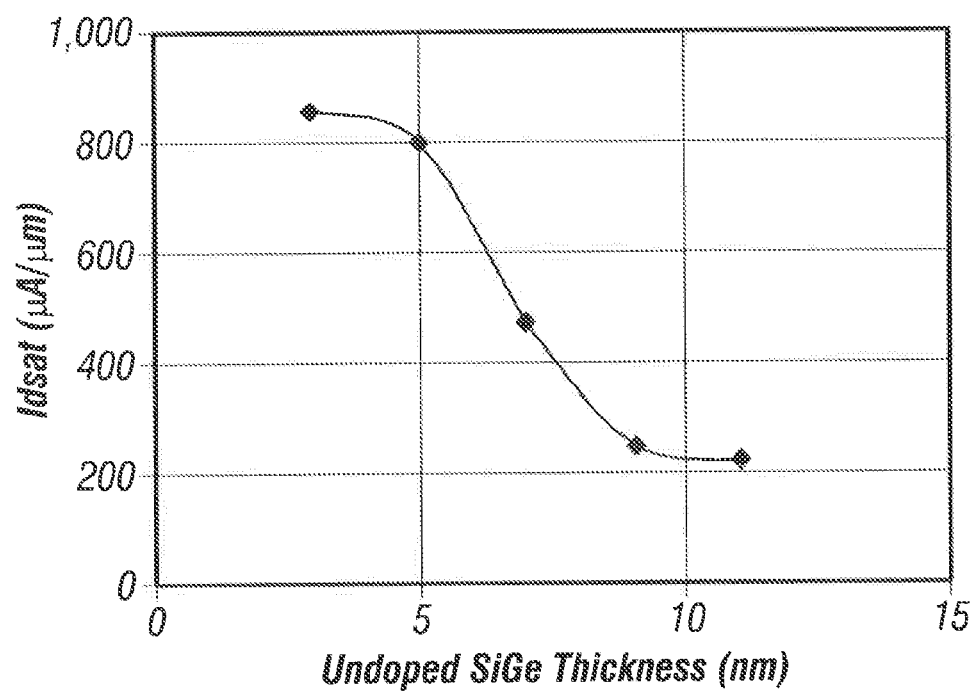

FIGS. 11A and 11B illustrate the effect of the undoped SiGe layer thickness on the subthreshold leakage current and drive current of exemplary PMOS DDC transistors having SiGe source and drain projections in accordance with certain embodiments. FIG. 11A is a graph illustrating the band-toband tunneling leakage current (Iboff) of an exemplary PMOS DDC transistor as a function of the substantially undoped SiGe layer thickness. This graph illustrates that the subthreshold leakage current of the DDC transistor decreases with increasing thickness of the substantially undoped SiGe outer layer. FIG. 11B is a graph illustrating the drive current (Idsat) of an exemplary PMOS DDC transistor as a function of the substantially undoped SIGe outer layer thickness. This graph illustrates that the drive current of the DDC transistor decreases as the thickness of the substantially undoped SiGe layer increases. For a typical embodiment of the DDC transistor, the undoped SiGe layer outer portion thickness may be about 5 nm.

Figure 12A:
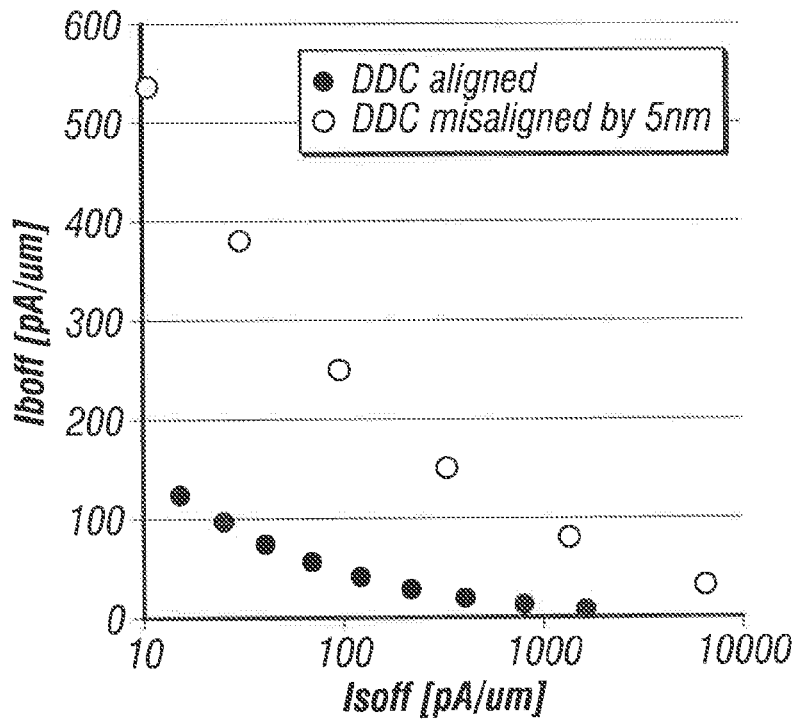
FIGS. 12A-12C illustrate effects of a positioning and misalignment of a screening region relative to the position of the SiGe projection.
Figure 12B:
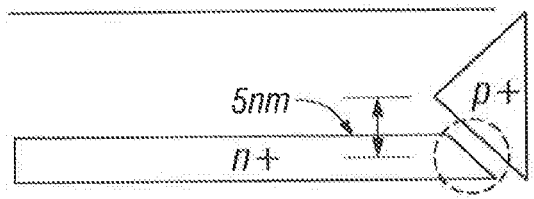
Figure 12C:
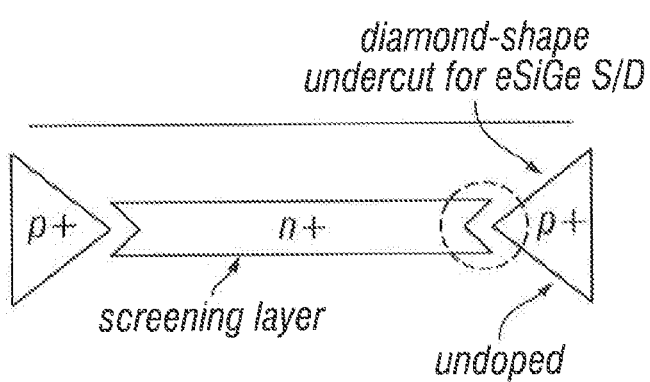

FIGS. 12A-12C illustrate the effect of the screening region position relative to the position of the SiGe projection for an exemplary PMOS DDC transistor in accordance with certain embodiments. FIG. 12A illustrates the junction leakage current primarily caused by band-to-band tunneling (Iboff) as a function of channel leakage current (Isoff) for two different screening region positions, i.e., where the screening region is substantially aligned with respect to the position of the diamond shaped SiGe projection (e.g., as illustrated in FIG. 12C) and where the screening region is misaligned by 5 nm with respect to the diamond shaped SiGe projection (as illustrated in FIG. 12B). FIG. 12A shows that a DDC transistor having a screening region that is substantially aligned with the location of the diamond shaped SiGe projection has lower junction leakage current for the same channel leakage current. It is noted that even though FIGS. 12A-12C illustrate embodiments having reduced leakage currents as a result of substantially aligning the screening region with the diamond shaped projection of the SiGe source/drain, similar leakage current reductions can be obtained for alternative embodiments where the SiGe projection does not have a diamond shape (e.g., the SiGe projection has a rounded shape) by substantially aligning the screening layer with the location of the maximum projection.

Figure 13:
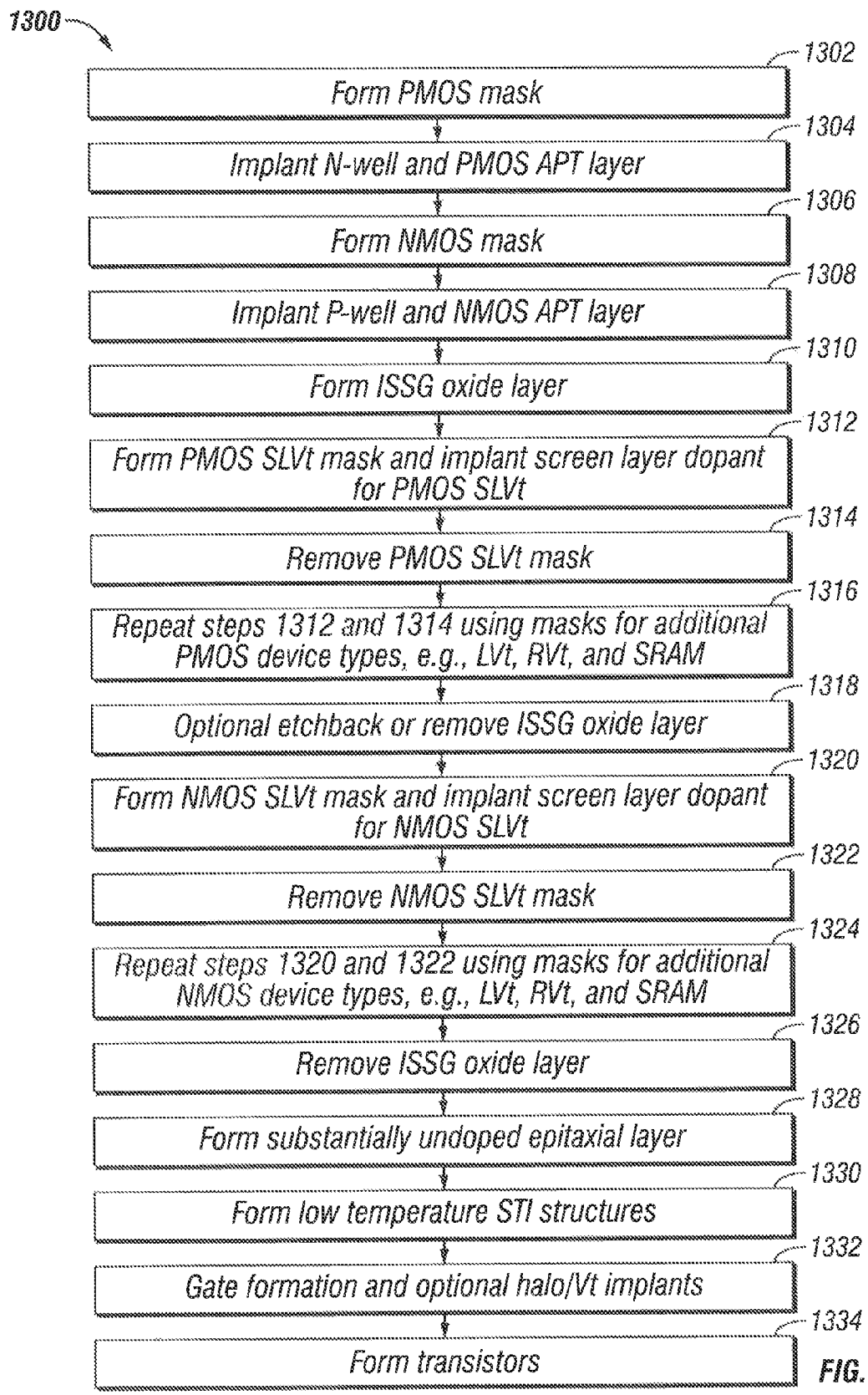
FIG. 13 is a flow chart illustrating a fabrication process useful to achieve multiple transistor devices on a substrate.

In addition to adjusting the position of the screening region relative to the source/drain projection, undercut, or notch, the subthreshold leakage current of the DDC transistor can also be reduced by reducing the thickness of the screening region, i.e., by reducing the width of the screening region dopant profile, regardless of the placement of the screening region relative to the projection, undercut, or notch of the source and drain. In one embodiment, the width and depth of the screening region dopant profile is controlled by implanting the screening region through an oxide layer, for which the oxide layer may be made of ISSG (steam-grown oxide). The ISSG oxide layer thickness affects the width and depth of the screening region dopant profile that is to be implanted for a specific implant energy. The width and depth of the screening region dopant profile is generally reduced for a given energy and ion implant dose amount when it is implanted through a thicker ISSG layer. FIG. 13 is a flow chart 1300 illustrating a fabrication process useful to achieve multiple transistor devices on a substrate, wherein the screening region is implanted through an ISSG oxide layer. Though discussed in terms of fabricating an NMOS super low threshold voltage device element (SLVT), an NMOS low threshold voltage device element (LVT), an NMOS standard or regular threshold voltage device element (RVT), an NMOS static random access memory (SRAM) device element, a PMOS super low threshold voltage device element (SLVT), a PMOS low threshold voltage device element (LVT), a PMOS standard or regular threshold voltage device element (RVT), and a PMOS static random access memory (SRAM) device element, other device elements having different electrical characteristics can be fabricated as well.

In FIG. 13, a chemical oxide layer having a thickness of the order of less than 1 nm may be formed on substrate. The chemical oxide layer may have a thickness of approximately 0.5 nm and serves to protect the substrate surface during subsequent ion implantation. The chemical oxide layer may be formed based upon any process involving a chemical reaction with a surface of silicon where the resultant film is a thin native oxide layer. At step 1302, a PMOS mask is formed on the chemical oxide layer exposing areas were PMOS transistors are to be formed. At step 1304, an N-well and an optional PMOS anti-punchthrough (APT) layer are implanted in the areas exposed by the PMOS mask.

After the N-well and APT implants for the PMOS transistors, the chemical oxide layer and the PMOS mask are removed. At step 1306, a new chemical oxide layer may then be formed on the cleaned substrate and an NMOS mask is formed on the chemical oxide layer exposing areas where NMOS transistors are to be formed. At step 1308, a P-well and an optional NMOS anti-punchthrough (APT) layer are implanted in the areas exposed by the NMOS mask. In the exposed areas defined by the NMOS mask, a p-type dopant implant, such as boron, is performed to form the P-well. A germanium implant effective to cause local amorphization of the silicon substrate in the top portion of the P-well (known as preamorphization implant or PAI implant) is performed. To inhibit migration of dopants upward towards the to-be-formed gate structure, carbon is introduced into the silicon by way of ion implantation. One or more anneal steps are performed to recrystallize the silicon and remove damage from the ion implantation steps. The anneal steps are carried out at a reduced temperature, such as a temperature of less than 1050° C.

After the P-well and APT implants for the NMOS transistors, the chemical oxide layer and the NMOS mask are removed. At step 1310, an ISSG oxide layer may be formed on the substrate. The ISSG oxide layer is usually formed in a rapid thermal process chamber or furnace, but spun on oxide material may be used, to provide for a thicker and denser oxide layer than the chemical oxide layer formed in the preceding steps. ISSG layer may be formed to a targeted thickness depending on the desired characteristics of being able to stop the ion implantation to thereby shrink the thickness of the screening region. At step 1312, a PMOS SLVt (super low Vt) mask is formed on the ISSG oxide layer, exposing areas where PMOS SLVt transistor device types are to be formed, and a PMOS screen layer dopant is implanted in the exposed areas defined by the PMOS SLVt mask to form the screening regions for the PMOS SLVt transistor device types. At step 1314, the PMOS SLVt mask is stripped away using a process that is selective to the ISSG oxide layer so as to leave the ISSG oxide layer substantially as it is.

At step 1316, the steps 1312 and 1314 are repeated for additional PMOS transistor device types to be formed to create a system-on-chip (SoC). For a SoC that includes PMOS LVt (low Vt) transistor device types, the PMOS LVt transistors are formed on the substrate by forming a PMOS LVt mask on the ISSG oxide layer, exposing areas where PMOS LVt transistor device types are to be formed, and a PMOS screen layer dopant is implanted in the exposed areas defined by the PMOS LVt mask to form the screening regions for the PMOS LVt transistor device types. In effect, screen implants are added so that the higher Vt devices have higher dopant concentrations for the screen regions. After the dopant implants for the PMOS RVt (regular Vt) transistors have been performed, the PMOS RVt mask is stripped away using a process that is selective to the ISSG oxide layer. For a SoC that includes PMOS RVt transistor device types, the PMOS RVt transistors are formed on the substrate by forming a PMOS RVt mask on the ISSG oxide layer, exposing areas where PMOS RVt transistors are to be formed, and a PMOS screen layer dopant is implanted in the exposed areas defined by the PMOS RVt mask to form the screening regions for the PMOS RVt transistors. After the dopant implants for the PMOS RVt transistors have been performed, the PMOS RVt mask is stripped away using a process that is selective to the ISSG oxide layer. For a SoC that includes static random access memory (SRAM), the PMOS SRAM transistors, being of the highest Vts, are formed on the substrate by forming a PMOS SRAM mask on the ISSG oxide layer, exposing areas where PMOS SRAM transistors are to be formed, and a PMOS screen layer dopant is implanted in the exposed areas defined by the PMOS SRAM mask to form the screening regions for the PMOS SRAM transistors. After the dopant implants for the PMOS SRAM transistors have been performed, the PMOS SRAM mask is stripped away using a process that is selective to the ISSG oxide layer. Typically, different implant energies and/or implant doses are used for implanting the screen layer dopants for the PMOS SLVt, LVt, RVt, and SRAM transistor device types, but all the implants are performed through an ISSG oxide layer having the same thickness. In alternative embodiments, the ISSG oxide layer can be etched back, thickened by going through additional ISSG growth processing, or it can be stripped and regrown between the screen implant steps for the different transistor device types such that one or more of the screen layer dopant implants for the PMOS SLVt, LVt, RVt, and SRAM transistor device types are performed through ISSG oxide layers having different thicknesses.

At step 1318, the ISSG oxide layer can be etched back to a desired reduced thickness for the NMOS screen layer implant species to be performed through a ISSG oxide layer of a suitable thickness for the NMOS screen region. Note that alternatively at step 1318, the NMOS screen layer dopants can be implanted through a chemical oxide layer instead of ISSG, in which case a chemical oxide layer is formed instead of ISSG. In one embodiment, where the NMOS DDC transistors to be fabricated are targeted to have a relatively shallow-placed highly doped screening region (positioned very close or abutting the bottom of the LDD region) with boron dopants, the screening region may be implanted through a chemical oxide layer as the NMOS DDC transistor in particular can be sensitive to dopant dose loss that results from implanting through an ISSG oxide layer. At step 1320, an NMOS SLVt mask is formed on the ISSG oxide layer, exposing areas where NMOS SLVt transistor device types are to be formed, and an NMOS screen layer dopant is implanted in the exposed areas defined by the NMOS SLVt mask to form the screening regions for the NMOS SLVt transistor device types. At step 1322, the NMOS SLVt mask is stripped away using a process that is selective to the ISSG oxide layer so as to leave the ISSG oxide layer substantially as it is.

At step 1324, the steps 1320 and 1322 are repeated for additional NMOS transistor device types to be formed on the SoC. For a SoC that includes NMOS LVt transistor device types, the NMOS LVt transistors are formed on the substrate by forming a NMOS LVt mask on the ISSG oxide layer, exposing areas where NMOS LVt transistors are to be formed, and a NMOS screen layer dopant is implanted in the exposed areas defined by the NMOS LVt mask to form the screening regions for the NMOS LVt transistors. After the dopant implants for the NMOS RVt transistors have been performed, the NMOS RVt mask is stripped away using a process that is selective to the ISSG oxide layer. For a SoC that includes NMOS RVt transistor device types, the NMOS RVt transistors are formed on the substrate by forming an NMOS RVt mask on the ISSG oxide layer, exposing areas where NMOS RVt transistors are to be formed, and an NMOS screen layer dopant is implanted in the exposed areas defined by the NMOS RVt mask to form the screening regions for the NMOS RVt transistors. After the dopant implants for the NMOS RVt transistors have been performed, the NMOS RVt mask is stripped away using a process that is selective to the ISSG oxide layer. For a SoC that includes static random access memory (SRAM), the NMOS SRAM transistors are formed on the substrate by forming an NMOS SEAN mask on the ISSG oxide layer, exposing areas where NMOS SRAM transistors are to be formed, and an NMOS screen layer dopant is implanted in the exposed areas defined by the NMOS SRAM mask to form the screening regions for the NMOS SRAM transistors. After the dopant implants for the NMOS SRAM transistors have been performed, the NMOS SRAM mask is stripped away using a process that is selective to the ISSG oxide layer. Typically, different implant energies and/or implant doses are used for implanting the screen layer dopants for the NMOS SLVt, LVt, RVt, and SRAM transistor device types, but all the implants are performed through an ISSG oxide layer having the same thickness. In alternative embodiments, the ISSG oxide layer can be etched back, thickened by going through additional ISSG growth processing, or it can be stripped and regrown between the screen implant steps for the different transistor device types, such that one or more of the screen layer dopant implants for the NMOS SLVt, LVt, RVt, and SRAM transistor device types are performed through ISSG oxide layers having different thicknesses.

At step 1326, the ISSG oxide layer is then also stripped away using a process that is highly selective to the silicon therebelow, preferably a hydrogen fluoride solution formulated to etch the desired film cleanly. Alternatively, the ISSG oxide layer strip is carried out using a process that effectively removes a limited portion of the underlying silicon, for instance, between 0 to 3 nanometers, to remove the surface portion that includes knock-on oxygen and other damage by the implant steps.

Prior to removing the ISSG oxide layer at step 1326, an optional high temperature anneal may be performed to activate the implanted dopants so as to retard dopant diffusion. In theory, if not first activated, the boron implant which is performed after formation of the ISSG oxide layer may diffuse in subsequent thermal steps. The optional high temperature anneal may be performed to place the boron in a substitutional state in the silicon crystalline lattice. The ISSG oxide layer may then be removed by a final clean. The final clean of the ISSG oxide layer may include a hydrofluoric HF acid cleaning and a de-ionized water rinse step followed by an optional ammonium hydroxide-hydrogen peroxide bath to remove a fixed amount of the surface of the substrate, so as to prepare the substrate for the next process sequence.

At step 1328, an undoped epitaxial layer is formed on the substrate, preceded by a further surface clean to remove any remaining oxide on the surface of the substrate and to prepare the substrate prior to forming the epitaxial layer. The epitaxial layer is preferably undoped, though intrinsically may be slightly doped at a level of approximately $1 \times 10^{17}$ atoms/cm$^3$. The epitaxial layer provides a substantially undoped channel layer for the transistor device elements formed on the substrate. The epitaxial layer may be formed by a blanket growth on the substrate, though a selective epitaxial growth process may be alternatively used. Subsequently, conventional CMOS features are formed including shallow trench isolation structure between device elements (step 1330) as well as gate oxide and gate formation and optional halo/threshold voltage implants and LDD implants (step 1332). At step 1334, additional features of the transistor device elements on the substrate are formed, including the formation of additional sidewall spacers, link region implants, source drain, implants, activating anneals, and I/O device implants. Gate, source, and drain contacts may then be formed for each device element according to fabrication processes known in the art, subject to a low thermal budget constraint, such that the processes are performed within the confines of a predetermined thermal budget to effectively reduce or avoid the diffusion of dopants from the doped regions formed below the substantially undoped channel.

Figure 14A:
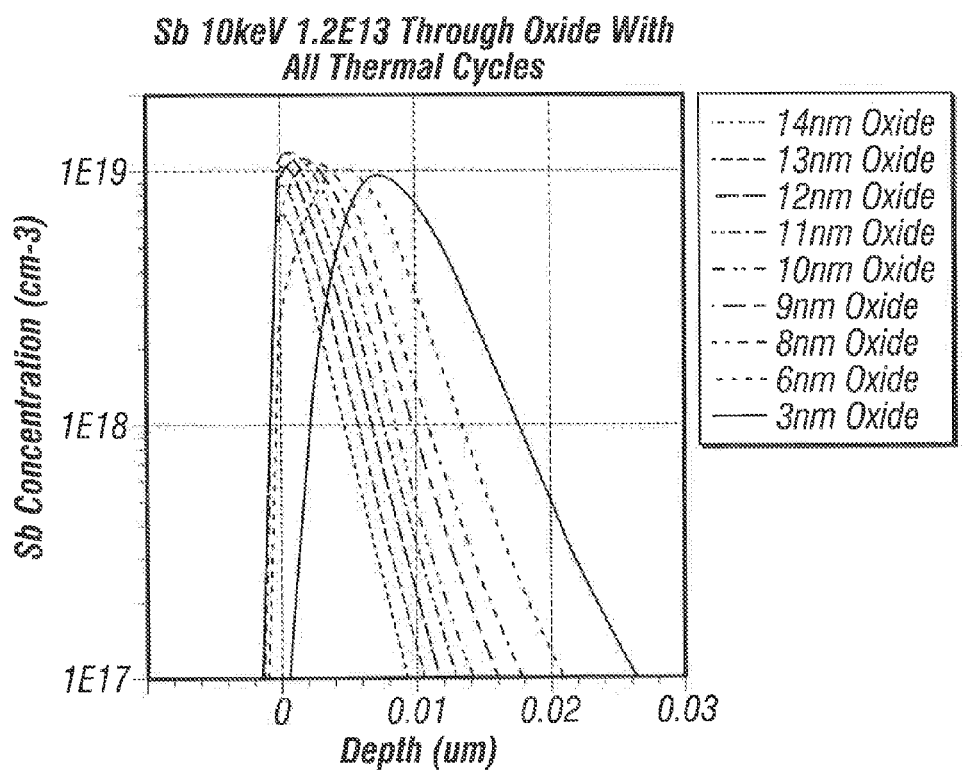
FIGS. 14A-14B illustrate screening region dopant profile differences if the dopant material is implanted through ISSG oxide layers having different thicknesses.

The ISSG oxide layer thickness determines the width of the screening region dopant profile that is to be implanted as well as the implant energy used to implant a screening region at a predetermined depth. FIG. 14A illustrates screening region dopant profiles obtained from different process embodiments where antimony implanted through ISSG oxide layers having different thicknesses. All of the screen dopant profiles illustrated in FIG. 14A correspond to an antimony screen implant performed at an implant energy of 10 keV and a dose of $1.2 \times 10^{13}$ atoms/cm$^2$. As shown in FIG. 14A, the spread of the screen dopant profile is reduced as the thickness of the ISSG oxide layer increases. Also, the peak of the screen dopant profile moves closer to the substrate surface as the thickness of the ISSG oxide layer increases. FIG. 14A also illustrates that high values of ISSG layer thickness may result in dose loss of the screen dopants, as seen for example by the lower peak screen dopant concentrations for the screen dopant profiles implanted through 12-14 nm thick ISSG oxide layers. It is noted that for shallow screen dopant profiles (e.g., for screen dopant profiles implanted through thicker ISSG oxide layers), significant screen dopant dose loss may also result from silicon loss during various etching and cleaning steps performed after implanting the screening region. Various embodiments of the process described above perform the screen dopant implants through a predetermined ISSG oxide layer thickness selected to obtain a screen dopant profile having a target peak concentration, target peak location, target depth, and target spread in the presence of such screen dopant dose loss.

Figure 14B:
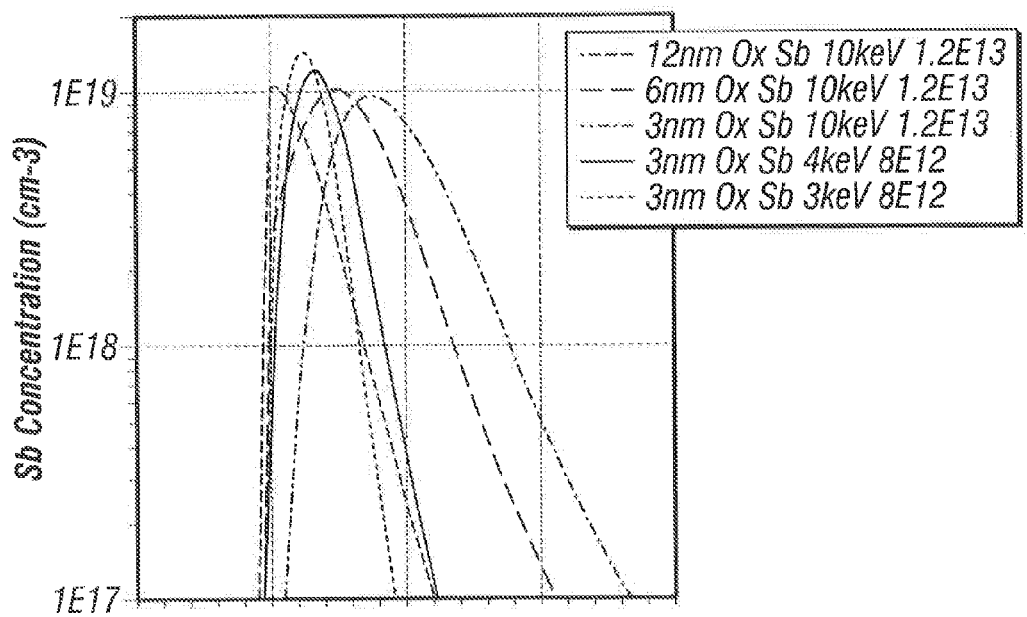

FIG. 14B illustrates the screen doping profiles obtained from different process embodiments where antimony is implanted through ISSG oxide layers having different thicknesses using different implant energies and implant doses. It is observed that the implant energy used to implant a screening region at a predetermined depth increases with increasing ISSG oxide layer thickness and, therefore, a higher implant energy can be used when implanting through a thicker ISSG oxide layer. This may be advantageously used to obtain a target screen dopant profile when the implant energy used to implant the screen dopants cannot be reduced below a certain level. It is also observed from FIG. 14B, that for an implant energy of 10 keV, the width of the screening region dopant profile is reduced as the screening region is implanted through a thicker ISSG oxide layer.

Figure 15:
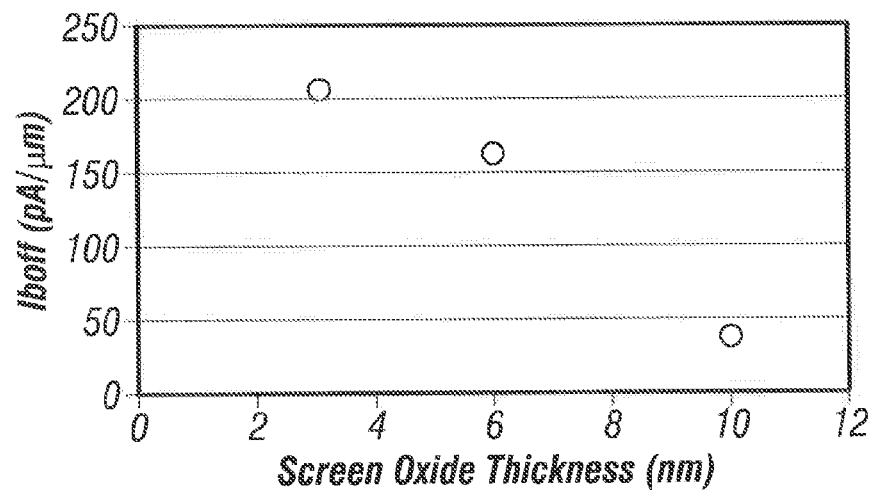
FIG. 15 illustrates exemplary subthreshold leakage current trends for screening regions implanted through ISSG oxide layers of different thicknesses.

FIG. 15 illustrates the subthreshold leakage current for screening regions implanted through ISSG oxide layers of different thicknesses. The leakage currents are obtained from TCAD simulations where antimony is implanted using an implant energy of 10 keV at an implant dose of $1.3 \times 10^{13}$ atoms/cm$^2$. FIG. 15 confirms that the subthreshold leakage current of the DDC transistor is reduced when the screening region is implanted through a thicker ISSG oxide layer.

Implanting the screening layer through an ISSG oxide layer has several advantages, including the ability to locate the screen layer higher up toward the bottom of the gate, which helps to improve against subthreshold leakage. Additionally, having an ISSG oxide through which the implantation is performed allows the use of higher implant energies than would be required without the ISSG oxide layer to achieve the equivalent size and location of the screen region, thereby providing a reasonable manufacturing accommodation for cases where a manufacturing environment has only high energy implantation tools. A thin ISSG oxide layer also serves to provide a layer of protective oxide through which ion implantation can be performed to implant dopants in the substrate directly below the protective oxide. An additional benefit of using the ISSG layer is that it is robust and therefore can tolerate multiple implants before it needs to be replaced, unlike a chemical oxide layer which tends to weaken and degrade with each ion implantation and therefore must be removed and replaced often. An ISSG oxide layer also tolerates most photoresist removal techniques, including aching or wet etch, that allow a photoresist masking film to be removed cleanly and selectively to the ISSG oxide layer immediately therebelow. Further examples of transistor structure and manufacture suitable for implanting screening regions through an ISSG oxide layer to form multiple DDC transistor device types in a SoC are disclosed in U.S. patent application Ser. No. 13/482,394 filed May 29, 2012 titled "Method for Substrate Preservation During Transistor Fabrication", by Lance Scudder, et al., the entire contents of which are hereby incorporated by reference herein.

Formation of an ISSG oxide layer preferably occurs very early in the process, prior to the formation of the wells (i.e., the N-well and the P-well), though alternatively as illustrated in the embodiment 1300, a chemical oxide film may be used for purposes of the well implants and a subsequent ISSG oxide layer may be formed to serve as a buffer layer for the various screening region and threshold voltage set region implants. An example ISSG process may include subjecting a silicon substrate to a temperature of 800° C. to 825° C. for the time needed to attain the desired thickness (usually taking only seconds) in an ambient that typically includes oxygen and some hydrogen to form the desired oxide film on the silicon substrate. The preferred sequence for using an ISSG oxide layer is prior to the formation of implanted regions where the resultant depth of the doped region is specified. Alternatively, an ISSG oxide layer can be used in a context where materials are selected or treatment is to be performed to the substrate so as to inhibit the migration of previously introduced dopants. Though an ISSG oxide layer is usually not used for the Ge PAI step, an ISSG oxide layer may be used immediately thereafter to serve as a buffer for to-be-implanted dopants.

Figure 16:
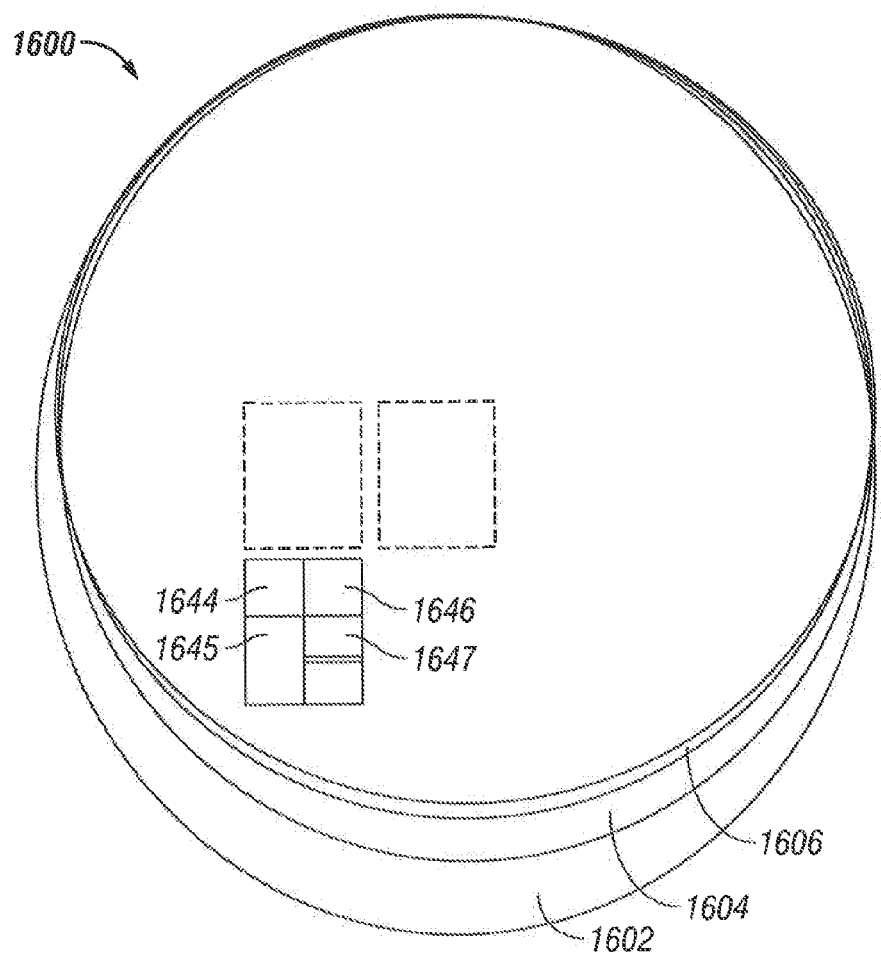
FIG. 16 illustrates a semiconductor wafer supporting multiple die, each of which can support multiple blocks of circuitry, each block having one or more transistor types.

FIG. 16 illustrates a semiconductor wafer 1600 supporting multiple die such as previously described. In accordance with the present disclosure, each die can support multiple blocks of circuitry, each block having one or more transistor types. Such an arrangement enables the creation of complex SoC integrated circuits or similar die that optionally include FETs tailored for analog or digital circuit applications along with improved transistors such as DDC transistors. For example, four typical blocks in a single die are illustrated as follows: block 1644 outlines a collection of deeply depleted channel (DDC) transistors having low threshold voltage, block 1645 outlines a collection of DDC transistors having regular threshold voltage, block 1646 outlines a collection of DDC transistors having high threshold voltage, and block 1647 outlines a collection of DDC transistors tailored for a static random access memory cell. As will be appreciated, these transistor types are representative and not intended to limit the transistor device types that can be usefully formed on a die or wafer. Wafer 1600 includes a semiconductor substrate 1602 (typically silicon) that can be implanted with optional anti-punchthrough, and single or dual implant screening regions (not shown) and an epitaxial blanket layer 1606 formed after implantation of dopants in screening region 1604. Wafer 1600 can also include an optional threshold voltage set region (not shown in FIG. 16) positioned between screening layer 1604 and epitaxial blanket layer 1606.

Transistors created according to the foregoing embodiments, structures, and processes can be formed on the die alone or in combination with other transistor types. Transistors formed according to the disclosed structures and processes can have a reduced mismatch arising from scattered or random dopant variations as compared to conventional MOS analog or digital transistors. This is particularly important for transistor circuits that rely on closely matched transistors for optimal operation, including differential matching circuits, analog amplifying circuits, and many digital circuits in widespread use such as SRAM cells. Variation can be even further reduced by adoption of structures such as a screening region, an undoped channel, or a threshold voltage set region as described herein to further effectively increase headroom which the devices have to operate. This allows high-bandwidth electronic devices with improved sensitivity and performance. Transistors created according to the foregoing embodiments, structures, and processes can expectedly deliver distinct benefits over conventional planar transistors. For instance, for a 20 nm or 28 nm process technology, the foregoing transistors can provide a 15% to 40% improvement, in threshold voltage variation relative to conventional planar transistors at equivalent dimensions in the process technology. As a further example, for a 20 nm or 28 nm process technology, the foregoing transistors can provide a 10% to 30% improvement in DIBL. Exemplary physical gate lengths for such process technologies are approximately 30 nm and exemplary gate widths are 100 to 300 nm for logic gates and 60 to 70 nm for SRAM.

Although the present disclosure has been described in detail with reference to particular embodiments, it should be understood that various other changes, substitutions, and alterations may be made herein without departing from the spirit and scope of the structures and methods disclosed, herein. Numerous other changes, substitutions, variations, alterations, and modifications may be ascertained by those skilled in the art and it is intended that the present disclosure encompass all such changes, substitutions, variations, alterations, and modifications as falling within the spirit and scope of the structures and methods disclosed herein. Moreover, the present disclosure is not intended to be limited in any way by any statement in the specification.

What is claimed is:

1. A semiconductor transistor structure formed on a silicon substrate, comprising:
    a transistor gate on a top surface of the silicon substrate, the transistor gate having an effective gate length Lg, the transistor gate having two sides and a bottom with a bottom corner on each side defining a physical outer boundary of the gate;
    a source and drain extension region on either side of the transistor gate extending a distance inward from each side of the transistor gate, the source and drain extension regions defining two inner edges that form the effective gate length Lg, the source and drain extension regions being doped with a predefined dopant polarity;
    a deep source/drain doped region adjacent each of the source and drain extension regions, the deep source/drain doped regions being doped with a predefined dopant polarity that is the same as the dopant polarity for the source and drain extension regions, the deep source/drain doped regions having a dopant profile that includes a heavily doped portion therewithin;
    wherein the source/drain doped region and the source and drain extension region on each side of the transistor gate are in electrical contact with each other, the location of the electrical contact forming an interface;
    a substantially undoped channel portion that defines the space between the source and drain extension regions and the deep source/drain doped regions; and
    a screening region comprising a highly doped region of opposite polarity from the polarity of the deep source/drain doped regions and the source and drain extension regions, the screening region being immediately below the substantially undoped channel portion, the screening region extending laterally between the deep source/drain doped regions, the screening region having a dopant concentration of $5 \times 10^{18}$ to $1 \times 10^{20}$ atoms/cm$^3$;
    wherein the screening region is located a vertical depth below the substrate surface, the screening region being no closer to the gate than the interface and wherein the screening region is positioned to be either above or below the heavily doped portion of the deep source/drain doped regions;
    and further including an outer portion defining a substantially undoped space region that substantially follows the combined shape of the deep source/drain doped regions and the source and drain extension regions, the outer portion having an outer edge that abuts the substantially undoped channel portion, the outer edge defining the interface, the screening region extending substantially to the outer edge of the outer portion.

2. The semiconductor transistor structure of claim 1, wherein the source and drain extension regions are raised above the surface level of the substrate.

3. The semiconductor transistor structure of claim 2, wherein the raised source and drain extension regions are formed using epitaxially grown silicon.

4. The semiconductor transistor structure of claim 1, wherein the source and drain extension regions and the deep source/drain doped regions form a shallow junction.

5. The semiconductor transistor structure of claim 1, further comprising:
    a threshold voltage set region located immediately above the screening region, the threshold voltage set region being coextensive with and abutting the screening region.

6. The semiconductor transistor structure of claim 5, wherein both the threshold voltage set region and the screening region abut the deep source/drain doped regions.

7. The semiconductor transistor structure of claim 1, further including a concentration of germanium in the substantially undoped channel layer, the concentration of germanium sufficient to effect a widening of the Lg compared to the case of not using the concentration of germanium.

8. The semiconductor transistor structure of claim 7, wherein the concentration of germanium is introduced into the substantially undoped channel layer by way of ion implantation.

9. A semiconductor transistor structure formed on a silicon substrate, comprising:
- a transistor gate formed by way of a starting point temporary dummy gate structure, the starting point temporary dummy gate structure having a first horizontal and first vertical dimension;
- a source and drain extension doped region formed on each side of the temporary dummy gate structure using the temporary dummy gate structure as a mask, the source and drain extension doped regions being separated on each side of the temporary dummy gate structure by a first lateral distance and thereby defining an effective gate length Lg;
- a final transistor gate formed after removing the temporary dummy gate structure, the final transistor gate having the first horizontal dimension but having a second vertical dimension, the second vertical dimension establishing a substantially horizontal bottom of the final transistor gate, the second vertical dimension achieved by forming a portion of the final transistor gate a vertical distance down into the silicon substrate;
- a deep source and drain doped region adjacent each of the source and drain extension doped regions and separated from each other by a second lateral distance, the second lateral distance being greater than the first lateral distance, the deep source and drain doped regions extending a vertical distance into the silicon substrate, the deep source and drain doped regions having a substantially horizontal bottom;
- wherein each of the source and drain extension doped regions and the deep source and drain doped regions are doped using dopants of a preselected polarity, the deep source and drain doped region and the source and drain extension doped region on each side of the transistor gate are in electrical contact with each other, the location of the electrical contact forming an interface; and
- a highly doped screening region having a dopant concentration of about $5 \times 10^{18}$ to $1 \times 10^{20}$ atoms/cm$^3$, the highly doped screening region peak concentration point being located above the bottom of the deep source and drain doped region, the highly doped screening region being separated from the bottom of the final transistor gate by a substantially undoped channel layer, the highly doped screening region extending laterally between the deep source and drain doped region and having a finite thickness;
- and further including an outer portion defining a substantially undoped space region that substantially follows the combined shape of the deep source and drain doped regions and the source and drain extension doped regions, the outer portion having an outer edge that abuts the substantially undoped channel portion, the outer edge defining the interface, the screening region extending substantially to the outer edge of the outer portion.

10. The semiconductor transistor structure of claim 9, further comprising:
- a threshold voltage set region having a defined dopant concentration, the threshold voltage set region being located immediately above the highly doped screening region and extending laterally between the deep source and drain doped regions coextensive with the highly doped screening region, the threshold voltage set region being separated from the bottom of the final transistor gate by the substantially undoped channel layer.

11. The semiconductor transistor structure of claim 9, wherein the final transistor gate comprises a metal material.

12. The semiconductor transistor structure of claim 9, wherein the screening region is located from the bottom of the final transistor gate a distance of Lg/1.5 to Lg/5.

13. A semiconductor transistor structure formed in a silicon substrate, comprising:
- a screening region in the silicon substrate, the screening region comprising a doped region that is of a defined thickness and extends laterally across the substrate, the screening region being doped with at least one dopant species effective to create a first polarity for the screening region, the screening region being doped to a dopant concentration of about $5 \times 10^{18}$ to $1 \times 10^{20}$ atoms/cm$^3$;
- a substantially undoped channel portion that is directly above the screening region and effective to separate the screening region from the top surface of the silicon substrate;
- a deep source/drain structure on either side of the screening region, the deep source/drain structure extending a defined depth that is deeper than the thickness of the screening region, the deep source/drain structure being doped with at least one dopant species effective to create a second polarity that is opposite of the first polarity; and
- a doped upper portion extending to the top surface of the silicon substrate, the doped upper portion defining an effective gate length for the channel structure, the doped upper portion which may be angled inward, angled outward, be substantially vertical or follow a curved shape that adjoins the deep source/drain structure at an interface;
- wherein the screening region is located to be laterally located either along the same plane as the interface or a distance below the interface, but not above the interface;
- and further including an outer portion defining a substantially undoped space region that substantially follows the combined shape of the deep source/drain structure and doped upper portion, the outer portion having an outer edge that abuts the substantially undoped channel portion, the outer edge defining the interface, the screening region extending substantially to the outer edge of the outer portion.

14. The semiconductor transistor structure of claim 13, wherein the outer portion is made of undoped silicon germanium.

15. The semiconductor transistor structure of claim 13, wherein the deep source/drain structure is formed using epitaxial growth.

16. The semiconductor transistor structure of claim 13, further comprising:
- a threshold voltage set region between the screening region and the undoped channel layer.

17. The semiconductor transistor structure of claim 13, wherein the screening region is formed using ion implantation.

18. The semiconductor transistor structure of claim 17, wherein the screening region is formed through a pre-formed ISSG oxide layer that is effective to create a screening region having a preselected depth, thickness, and dopant concentration.

19. The semiconductor transistor structure of claim 13, wherein the screening region is of a thickness of about 3 nm to 40 nm.

* * * * *